US009535323B2

(12) United States Patent
Takanashi

(10) Patent No.: US 9,535,323 B2
(45) Date of Patent: Jan. 3, 2017

(54) LITHOGRAPHIC PRINTING PLATE PRECURSOR AND PLATE MAKING METHOD OF LITHOGRAPHIC PRINTING PLATE

(71) Applicant: FUJIFILM CORPORATION, Tokyo (JP)

(72) Inventor: Genki Takanashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/667,949

(22) Filed: Mar. 25, 2015

(65) Prior Publication Data

US 2015/0198878 A1    Jul. 16, 2015

Related U.S. Application Data

(63) Continuation of application No. PCT/JP2013/072112, filed on Aug. 19, 2013.

(30) Foreign Application Priority Data

Sep. 26, 2012    (JP) ................................. 2012-213071

(51) Int. Cl.
| | |
|---|---|
| *G03F 7/00* | (2006.01) |
| *G03F 7/027* | (2006.01) |
| *B41C 1/10* | (2006.01) |
| *G03F 7/038* | (2006.01) |
| *G03F 7/20* | (2006.01) |

(52) U.S. Cl.
CPC ............. *G03F 7/027* (2013.01); *B41C 1/1008* (2013.01); *G03F 7/038* (2013.01); *G03F 7/20* (2013.01); *B41C 2210/04* (2013.01); *B41C 2210/08* (2013.01); *B41C 2210/22* (2013.01)

(58) Field of Classification Search
None
See application file for complete search history.

(56) References Cited

U.S. PATENT DOCUMENTS

| | | |
|---|---|---|
| 7,005,234 B2 | 2/2006 | Hoshi et al. |
| 7,026,097 B2 | 4/2006 | Hoshi et al. |
| 7,261,998 B2 | 8/2007 | Hayashi et al. |
| 8,142,978 B2 | 3/2012 | Aoshima |
| 8,142,982 B2 | 3/2012 | Oya et al. |
| 2002/0177074 A1 | 11/2002 | Hoshi et al. |
| 2003/0064318 A1 | 4/2003 | Huang et al. |
| 2004/0214105 A1 | 10/2004 | Hoshi et al. |
| 2005/0003285 A1 | 1/2005 | Hayashi et al. |
| 2006/0257783 A1* | 11/2006 | Sugasaki ............... C08F 220/34 430/270.1 |
| 2008/0286685 A1 | 11/2008 | Aoshima |
| 2008/0318155 A1* | 12/2008 | Suzuki .................. B41C 1/1016 430/270.1 |
| 2009/0111049 A1 | 4/2009 | Oya et al. |

FOREIGN PATENT DOCUMENTS

| | | |
|---|---|---|
| CN | 1972803 A | 5/2007 |
| EP | 2 610 067 A1 | 7/2013 |
| JP | 1-227141 A | 9/1989 |
| JP | 11-174667 A | 7/1997 |
| JP | 2001-277740 A | 10/2001 |
| JP | 2001-277742 A | 10/2001 |
| JP | 2002-287334 A | 10/2002 |
| JP | 2007-47742 A | 2/2007 |
| JP | 2008-284817 A | 11/2008 |
| JP | 2009-154525 A | 7/2009 |
| JP | 2012-66577 A | 4/2012 |

OTHER PUBLICATIONS

Int. Search Report dated Sep. 17, 2013 in Int. Application No. PCT/JP2013/072112 (PCT/ISA/210).
Written Opinion dated Sep. 17, 2013 in Int. Application No. PCT/JP2013/072112 (PCT/ISA/237).
Communication dated Dec. 2, 2015 issued by Chinese Intellectual Property Office in counterpart Chinese Patent Application No. 201380050337.7.
Office Action dated Aug. 2, 2016, issued by the State Intellectual Property Office of P.R. China in counterpart Chinese Application No. 201380050337.7.

* cited by examiner

*Primary Examiner* — Chanceity Robinson
(74) *Attorney, Agent, or Firm* — Sughrue Mion, PLLC

(57) ABSTRACT

By a lithographic printing plate precursor including a support having provided thereon an image-recording layer capable of forming an image by supplying at least any of printing ink and dampening water on a printing machine after image exposure to remove an unexposed area thereof, wherein the image-recording layer contains an infrared absorbing agent, a polymerization initiator, a polymerizable compound and a polysaccharide having a sulfonic acid group or a group made by a salt thereof and a plate making method of a lithographic printing plate using the same, a lithographic printing plate precursor which exhibits good development property while maintaining printing durability of a lithographic printing plate after development and a plate making method of a lithographic printing plate using the same can be provided.

9 Claims, No Drawings

LITHOGRAPHIC PRINTING PLATE PRECURSOR AND PLATE MAKING METHOD OF LITHOGRAPHIC PRINTING PLATE

CROSS REFERENCE TO RELATED APPLICATION

This is a continuation of International Application No. PCT/JP2013/072112 filed on Aug. 19, 2013, and claims priority from Japanese Patent Application No. 2012-213071 filed on Sep. 26, 2012, the entire disclosures of which are incorporated herein by reference.

TECHNICAL FIELD

The present invention relates to a lithographic printing plate precursor and a lithographic printing method. More particularly, it relates to a lithographic printing plate precursor preferably used for a lithographic printing plate precursor capable of undergoing a so-called direct plate making in which the plate making is directly conducted based on digital signals, for example, of a computer using various kinds of lasers and a plate making method of a lithographic printing plate using the same.

BACKGROUND ART

In general, a lithographic printing plate is composed of an oleophilic image area accepting ink and a hydrophilic non-image area accepting dampening water in the process of printing. Lithographic printing is a printing method utilizing the nature of water and oily ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (image-recording layer) is heretofore used. Specifically, the PS plate is exposed through a mask, for example, a lith film, and then subjected to development processing, for example, with an alkaline developer to remove the unnecessary image-recording layer corresponding to the non-image area by dissolving while leaving the image-recording layer corresponding to the image area, thereby obtaining the lithographic printing plate.

Due to the recent progress in the technical field, nowadays the lithographic printing plate can be obtained by a CTP (computer-to-plate) technology. Specifically, a lithographic printing plate precursor is directly subjected to scanning exposure using laser or laser diode without using a lith film and developed to obtain a lithographic printing plate.

With the progress described above, the issue on the lithographic printing plate precursor has transferred to improvements, for example, in image-forming property corresponding to the CTP technology, printing property or physical property. Also, with the increasing concern about global environment, as another issue on the lithographic printing plate precursor, an environmental problem on waste liquid discharged accompanying the wet treatment, for example, development processing comes to the front.

In response to the environmental problem, simplification of development or plate making or non-processing has been pursued. As one method of simple plate making, a method referred to as an "on-press development" is practiced. Specifically, according to the method after exposure of a lithographic printing plate precursor, the lithographic printing plate precursor is mounted as it is on a printing machine without conducting conventional development and removal of the unnecessary area of image-recording layer is performed at an early stage of printing process.

Also, as a method of simple development, a method referred to as a "gum development" is practiced in which removal of the unnecessary area of image-recording layer is performed using not a conventional highly alkaline developer but a finisher or gum solution having pH near neutral.

In the simplification of plate making operation as described above, a system using a lithographic printing plate precursor capable of being handled in a bright room or under a yellow lamp and a light source is preferred from the standpoint of workability. Thus, as the light source, a semiconductor laser emitting an infrared ray having a wavelength of 760 to 1,200 or a solid laser, for example, YAG laser, is used.

As the lithographic printing plate precursor capable of undergoing on-press development, for instance, a lithographic printing plate precursor having provided on a hydrophilic support, an image-recording layer (heat-sensitive layer) containing microcapsules having a polymerizable compound encapsulated therein is described in Patent Document 1 or 2. A lithographic printing plate precursor having provided on a support, an image-recording layer (photosensitive layer) containing an infrared absorbing agent, a radical polymerization initiator and a polymerizable compound is described in Patent Document 3. A lithographic printing plate precursor capable of undergoing on-press development having provided on a support, an image-recording layer containing a polymerizable compound and a graft polymer having a polyethylene oxide chain in its side chain or a block polymer having a polyethylene oxide block is described in Patent Document 4. A lithographic printing plate precursor capable of undergoing on-press development provided with an image-recording layer containing a specific development accelerating agent is described in Patent Document 5. A lithographic printing plate precursor capable of undergoing on-press development provided with an image-recording layer containing a specific acid group or a salt thereof is described in Patent Document 6.

PRIOR ART DOCUMENT

Patent Document

Patent Document 1: JP-A-2001-277740
Patent Document 2: JP-A-2001-277742
Patent Document 3: JP-A-2002-287334
Patent Document 4: U.S. Patent Publication No. 2003/0064318
Patent Document 5: JP-A-2008-284817
Patent Document 6: JP-A-2009-154525

DISCLOSURE OF THE INVENTION

Problems that the Invention is to Solve

However, with the demand on further improvement in the performance of lithographic printing plate precursor, a technique capable of achieving on-press development property and printing durability at a higher level has been actually required.

The present invention has been made in view of the problems described above, and it is an object of the invention to provide a lithographic printing plate precursor which exhibits good development property while maintaining printing durability of a lithographic printing plate after development and a plate making method of a lithographic printing plate using the same.

Means for Solving the Problems

Specifically, the means for solving the problems described above are as follows. In the specification, the range represented by using "to" indicates a range including the numerical values described before and after "to" as the minimum value and the maximum value, respectively.
(1) A lithographic printing plate precursor comprising a support having provided thereon an image-recording layer capable of forming an image by supplying at least any of printing ink and dampening water on a printing machine after image exposure to remove an unexposed area thereof, wherein the image-recording layer contains an infrared absorbing agent, a polymerization initiator, a polymerizable compound and a polysaccharide having a sulfonic acid group or a group made by a salt thereof.
(2) The lithographic printing plate precursor as described in (1) above, wherein the polysaccharide having a sulfonic acid group or a group made by a salt thereof has a structure represented by formula (A) shown below:

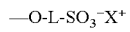    Formula (A)

wherein L represents an ethylene group or a propylene group, $X^+$ represents a hydrogen ion, an alkali metal ion or an ammonium ion.
(3) The lithographic printing plate precursor as described in (1) or (2) above, wherein the polysaccharide is cellulose having a sulfonic acid group or a group made by a salt thereof
(4) The lithographic printing plate precursor as described in (2) above, wherein the polysaccharide is cellulose having a sulfonic acid group or a group made by a salt thereof which has a repeating unit represented by formula (1) shown below:

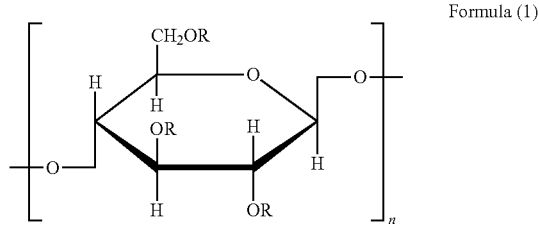    Formula (1)

wherein R each independently represents a hydrogen atom, an alkyl group, a hydroxyalkyl group, a carboxyalkyl group or $-L-SO_3^-X^+$, n represents an integer of 2 or more, and L and $X^+$ have the same meanings as L and $X^+$ in formula (A), provided that of three Rs in the repeating unit represented by formula (1), a number (substitution degree) of R represented by $-L-SO_3^-X^+$ is from 0.3 to 2.5.
(5) A plate making method of a lithographic printing plate comprising conducting on-press development processing by a method comprising after imagewise exposure of the lithographic printing plate precursor as described in any one of (1) to (4) above, mounting it on a printing machine and supplying at least any of printing ink and dampening water or a method comprising after mounting the lithographic printing plate precursor as described in any one of (1) to (4) above on a printing machine, imagewise exposing it and supplying at least any of printing ink and dampening water.

The mechanism of the invention is not clear, but it is supposed as follows.

The lithographic printing plate precursor according to the invention comprises a support having thereon an image-recording layer which contains an infrared absorbing agent, a polymerization initiator, a polymerizable compound and a polysaccharide having a sulfonic acid group or a group made by a salt thereof and which is capable of being removed with at least any of printing ink and dampening water.

It is supposed that since the image-recording layer contains the polysaccharide having a sulfonic acid group or a group made by a salt thereof, the hydrophilicity increases, the permeability of dampening water into the unexposed area (corresponding to a non-image area) increases and the removability of the non-image area is increased. On the other hand, it is supposed that the permeation of dampening water is hard to occur in the exposed area because of being crosslinked and since a high molecular weight material of the polysaccharide having a sulfonic acid group or a group made by a salt thereof is incorporated into the layer, the abrasion resistance in the exposed area can be maintained, whereby the printing durability is maintained.

Advantage of the Invention

According to the invention, a lithographic printing plate precursor which exhibits good development property while maintaining printing durability of a lithographic printing plate after development and a plate making method of a lithographic printing plate using the same can be provided.

MODE FOR CARRYING OUT THE INVENTION

Lithographic Printing Plate Precursor

The lithographic printing plate precursor according to the invention comprises a support having provided thereon an image-recording layer capable of forming an image by supplying at least any of printing ink and dampening water on a printing machine after image exposure to remove an unexposed area thereof, wherein the image-recording layer contains an infrared absorbing agent, a polymerization initiator, a polymerizable compound and a polysaccharide having a sulfonic acid group or a group made by a salt thereof.

Also, the lithographic printing plate precursor according to the invention can be provided with an undercoat layer between the support and the image-recording layer or a protective layer on the image-recording layer, if desired.

Hereinafter, the constituting components of the lithographic printing plate precursor according to the invention will be described.
[Image-Recording Layer]
The image-recording layer of the lithographic printing plate precursor according to the invention contains an infrared absorbing agent, a polymerization initiator, a polymerizable compound and a polysaccharide having a sulfonic acid group or a group made by a salt thereof.

[Infrared Absorbing Agent]

The infrared absorbing agent used in the polymerizable composition can be used without particular restriction as long as it absorbs light at the image exposure to form the excited state and provides energy to a polymerization initiator with electron transfer, energy transfer, heat generation or the like thereby increasing the polymerization initiation function. Particularly, an infrared absorbing agent having an absorption maximum in a wavelength range from 750 to 1,400 nm is preferably used. The infrared absorbing agent used is preferably a dye or a pigment.

As the dye, commercially available dyes and known dyes described in literatures, for example, *Senryo Binran*, compiled by The Society of Synthetic Organic Chemistry, Japan (1970) can be used. Specifically, the dye includes, for example, an azo dye, a metal complex azo dye, a pyrazolone azo dye, a naphthoquinone dye, an anthraquinone dye, a phthalocyanine dye, a carbonium dye, a quinoneimine dye, a methine dye, a cyanine dye, a squarylium dye, a pyrylium salt and a metal thiolate complex.

Of the dyes, a cyanine dye, a squarylium dye, a pyrylium salt, a nickel thiolate complex or an indolenine cyanine dye is particularly preferred. A cyanine dye or an indolenine cyanine dye is more preferred. As a particularly preferred example of the dye, a cyanine dye represented by formula (IV) shown below is exemplified.

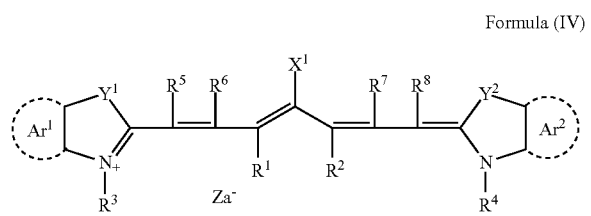

Formula (IV)

In formula (IV), $X^1$ represents a hydrogen atom, a halogen atom, $—N(R^9)(R^{10})$, $—X^2L^1$ or a group shown below. $R^9$ and $R^{10}$, which may be the same or different, each represents an aromatic hydrocarbon group having from 6 to 10 carbon atoms which may have a substituent, an alkyl group having from 1 to 8 carbon atoms which may have a substituent or a hydrogen atom, or $R^9$ and $R^{10}$ may be combined with each other to form a ring. $R^9$ and $R^{10}$ each preferably represents a phenyl group. $X^2$ represents an oxygen atom or a sulfur atom. $L^1$ represents a hydrocarbon group having from 1 to 12 carbon atoms, an aromatic ring group containing a hetero atom (N, S, O, a halogen atom, Se) or a hydrocarbon group having from 1 to 12 carbon atoms and containing a hetero atom. In the group shown below, $Xa^-$ has the same meaning as $Za^-$ defined hereinafter. $R^a$ represents a hydrogen atom or a substituent selected from an alkyl group, an aryl group, a substituted or unsubstituted amino group and a halogen atom.

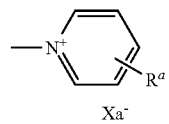

$R^1$ and $R^2$ in formula (IV) each independently represents a hydrocarbon group having from 1 to 12 carbon atoms. In view of the preservation stability of a polymerizable composition solution, it is preferred that $R^1$ and $R^2$ each represents a hydrocarbon group having two or more carbon atoms. Alternatively, $R^1$ and $R^2$ may be combined with each other to form a ring and in the case of forming a ring, it is particularly preferred to form a 5-membered ring or a 6-membered ring.

$Ar^1$ and $Ar^2$, which may be the same or different, each represents an aryl group which may have a substituent. Preferred examples of the aryl group include a benzene ring group and a naphthalene ring group. Preferred examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms which may have a substituent. Preferred examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (IV) has an anionic substituent in the structure thereof and neutralization of charge is not needed. Preferred examples of the counter ion for $Za^-$ include a halide ion, a perchlorate ion, a tetrafluoroborate ion, a hexafluorophosphate ion and a sulfonate ion, and particularly preferred examples thereof include a perchlorate ion, a hexafluorophosphate ion and an arylsulfonate ion in view of the preservation stability of a polymerizable composition solution.

Specific examples of the cyanine dye represented by formula (IV) include compounds described in Paragraph Nos. [0017] to [0019] of JP-A-2001-133969, Paragraph Nos. [0016] to [0021] of JP-A-2002-23360 and Paragraph Nos. [0012] to [0037] of JP-A-2002-40638, preferably compounds described in Paragraph Nos. [0034] to [0041] of JP-A-2002-278057 and Paragraph Nos. [0080] to [0086] of JP-A-2008-195018, and particularly preferably compounds described in Paragraph Nos. [0035] to [0043] of JP-A-2007-90850.

Also, compounds described in Paragraph Nos. [0008] to [0009] of JP-A-5-5005 and Paragraph Nos. [0022] to [0025] of JP-A-2001-222101 are preferably used.

Preferred specific examples of the infrared absorbing agent are set forth below, bur the invention should not be construed as being limited thereto.

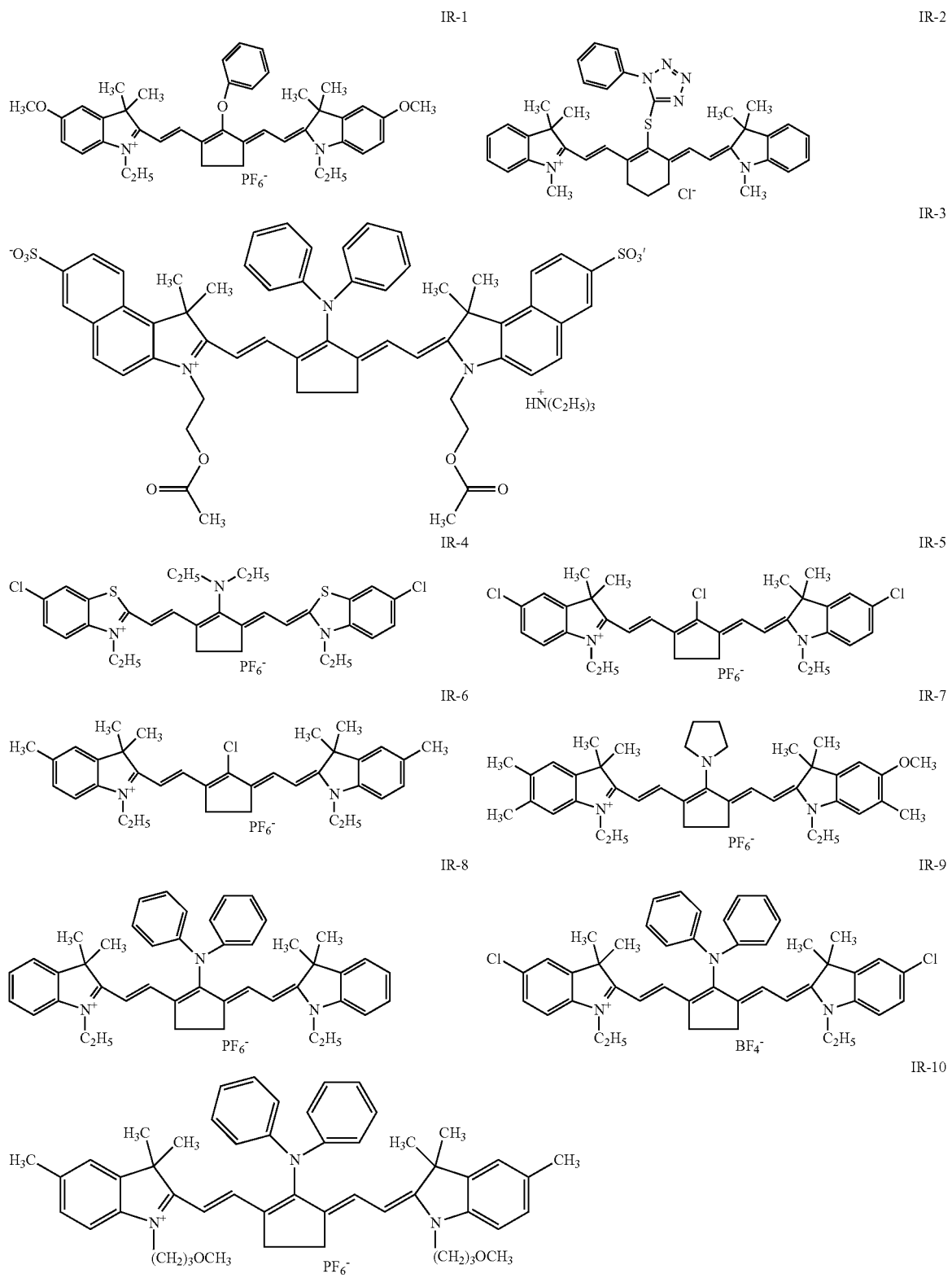
The infrared absorbing agent may be used only one kind or in combination of two or more kinds thereof, and it may also be used together with an infrared absorbing agent, for example, a pigment. As the pigment, compounds described in Paragraph Nos. [0072] to [0076] of JP-A-2008-195018 are preferred.

The content of the infrared absorbing agent is preferably from 0.05 to 30% by weight, more preferably from 0.1 to 20% by weight, particularly preferably from 0.2 to 10% by weight, based on 100 parts by weight of the total solid content of the image-recording layer.

[Polymerization Initiator]

The polymerization initiator for use in the invention indicates a compound which initiates or accelerates polymerization of a polymerizable compound. The polymerization initiator which can be used in the invention is preferably a radical polymerization initiator and includes, for example, known thermal polymerization initiators, compounds containing a bond having small bond dissociation energy and photopolymerization initiators.

The polymerization initiator according to the invention include, for example, (a) an organic halide, (b) a carbonyl compound, (c) an azo compound, (d) an organic peroxide, (e) a metallocene compound, (f) an azide compound, (g) a hexaarylbiimidazole compound, (h) an organic borate compound, (i) a disulfone compound, (j) an oxime ester compound and (k) an onium salt compound.

As the organic halide (a), compounds described in Paragraph Nos. [0022] to [0023] of JP-A-2008-195018 are preferred.

As the carbonyl compound (b), compounds described in Paragraph No. [0024] of JP-A-2008-195018 are preferred.

As the azo compound (c), for example, azo compounds described in JP-A-8-108621 can be used.

As the organic peroxide (d), for example, compounds described in Paragraph No. [0025] of JP-A-2008-195018 are preferred.

As the metallocene compound (e), for example, compounds described in Paragraph No. [0026] of JP-A-2008-195018 are preferred.

As the azide compound (f), a compound, for example, 2,6-bis(4-azidobenzylidene)-4-methylcyclohexanone is exemplified.

As the hexaarylbiimidazole compound (g), for example, compounds described in Paragraph No. [0027] of JP-A-2008-195018 are preferred.

As the organic borate compound (h), for example, compounds described in Paragraph No. [0028] of JP-A-2008-195018 are preferred.

As the disulfone compound (i), for example, compounds described in JP-A-61-166544 and JP-A-2002-328465 are exemplified.

As the oxime ester compound (j), for example, compounds described in Paragraph Nos. [0028] to [0030] of JP-A-2008-195018 are preferred.

As the onium salt compound (k), onium salts, for example, diazonium salts described in S. I. Schlesinger, *Photogr. Sci. Eng.*, 18, 387 (1974), T. S. Bal et al., *Polymer,* 21, 423 (1980) and JP-A-5-158230, ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U. S. Patent Publication No. 2008/0311520, JP-A-2-150848, JP-A-2008-195018 and J. V. Crivello et al., *Macromolecules,* 10 (6), 1307 (1977), sulfonium salts described in European Patents 370,693, 233,567, 297,443 and 297,442, U.S. Pat. Nos. 4,933,377, 4,760,013, 4,734,444 and 2,833,827 and German Patents 2,904,626, 3,604,580 and 3,604,581, selenonium salts described in J. V. Crivello et al., *J. Polymer Sci., Polymer Chem. Ed.,* 17, 1047 (1979), arsonium salts described in C. S. Wen et al., *Teh,* *Proc. Conf. Rad. Curing ASIA,* p. 478, Tokyo, October (1988), and azinium salts described in JP-A-2008-195018 are exemplified.

Of the polymerization initiators described above, an onium salt, in particular, an iodonium salt, an sulfonium salt or an azinium salt is more preferred. Specific examples of these compounds are set forth below, but the invention should not be construed as being limited thereto.

As examples of the iodonium salt, a diphenyliodonium salt is preferred. In particular, a diphenyliodonium salt substituted with an electron donating group, for example, an alkyl group or an alkoxy group is preferred, and an asymmetric diphenyliodonium salt is more preferred. Specific examples of the iodonium salt include diphenyliodonium hexafluorophosphate, 4-methoxyphenyl-4-(2-methylpropyl)phenyliodonium hexafluorophosphate, 4-(2-methylpropyl)phenyl-p-tolyliodonium hexafluorophosphate, 4-hexyloxyphenyl-2,4,6-trimethoxyphenyliodonium hexafluorophosphate, 4-hexyloxyphenyl-2,4-diethoxyphenyliodonium tetrafluoroborate, 4-octyloxyphenyl-2,4,6-trimethoxyphenyliodonium 1-perfluorobutanesulfonate, 4-octyloxyphenyl-2,4,6-trimethoxyphenyliodonium hexafluorophosphate and bis(4-tert-butylphenyl)iodonium tetraphenylborate.

Examples of the sulfonium salt include triphenylsulfonium hexafluorophosphate, triphenylsulfonium benzoylformate, bis(4-chlorophenyl)phenylsulfonium benzoylformate, bis(4-chlorophenyl)-4-methylphenylsulfonium tetrafluoroborate, tris(4-chlorophenyl)sulfonium 3,5-bis(methoxycarbonyl)benzenesulfonate and tris(4-chlorophenyl)sulfonium hexafluorophosphate.

Examples of the azinium salt include 1-cyclohexylmethyloxypyridinium hexafluorophosphate, 1-cyclohexyloxy-4-phenylpyridinium hexafluorophosphate, 1-ethoxy-4-phenylpyridinium hexafluorophosphate, 1-(2-ethylhexyloxy)-4-phenylpyridinium hexafluorophosphate, 4-chloro-1-cyclohexylmethyloxypyridinium hexafluorophosphate, 1-ethoxy-4-cyanopyridinium hexafluorophosphate, 3,4-dichloro-1-(2-ethylhexyloxyl)pyridinium hexafluorophosphate, 1-benzyloxy-4-phenylpyridinium hexafluorophosphate, 1-phenethyloxy-4-phenylpyridinium hexafluorophosphate, 1-(2-ethylhexyloxy)-4-phenylpyridinium p-toluenesulfonate, 1-(2-ethylhexyloxy)-4-phenylpyridinium perfluorobutanesulfonate, 1-(2-ethylhexyloxy)-4-phenylpyridinium bromide and 1-(2-ethylhexyloxy)-4-phenylpyridinium tetrafluoroborate.

The polymerization initiator according to the invention can be added preferably in an amount from 0.1 to 50% by weight, more preferably from 0.5 to 30% by weight, particularly preferably from 0.8 to 20% by weight, based on the total solid content constituting the image-recording layer. In the range described above, good sensitivity and good stain resistance in the non-image area at the time of printing are obtained.

[Polymerizable Compound]

The polymerizable compound for use in the image-recording layer according to the invention is not particularly limited. Of the polymerizable compounds, a polymerizable compound having at least one ethylenically unsaturated double bond is preferred, a polymerizable compound having at least one terminal ethylenically unsaturated double bond is more preferred, and a polymerizable compound having at least two terminal ethylenically unsaturated double bonds is particularly preferred. The preferred polymerizable compound has a chemical form, for example, a monomer, a prepolymer, specifically, a dimer, a trimer or an oligomer, or a mixture thereof.

Examples of the monomer include an unsaturated carboxylic acid (for example, acrylic acid, methacrylic acid, itaconic acid, crotonic acid, isocrotonic acid or maleic acid) and an ester or amide thereof. Preferably, an ester of an unsaturated carboxylic acid with a polyhydric alcohol compound and an amide of an unsaturated carboxylic acid with a polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of an unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen group or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used. These compounds are described in references including JP-T-2006-508380, JP-A-2002-287344, JP-A-2008-256850, JP-A-2001-342222, JP-A-9-179296, JP-A-9-179297, JP-A-9-179298, JP-A-2004-294935, JP-A-2006-243493, JP-A-2002-275129, JP-A-2003-64130, JP-A-2003-280187 and JP-A-10-333321.

Specific examples of the monomer, which is an ester of a polyhydric alcohol compound with an unsaturated carboxylic acid, include, as an acrylic acid ester, for example, ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO) modified triacrylate and polyester acrylate oligomer. As a methacrylic acid ester, for example, tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane and bis[p-(methacryloxy)phenyl]dimethylmethane are exemplified. Specific examples of the monomer, which is an amide of a polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Urethane type addition-polymerizable compounds produced using an addition reaction between an isocyanate and a hydroxy group are also preferably used and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule described in JP-B-48-41708.

$$CH_2=C(R^4)COOCH_2CH(R^5)OH \qquad (A)$$

wherein $R^4$ and $R^5$ each independently represents H or $CH_3$.

Also, urethane acrylates as described in JP-A-51-37193, JP-B-2-32293, JP-B-2-16765, JP-A-2003-344997 and JP-A-2006-65210, urethane compounds having an ethylene oxide skeleton described in JP-B-58-49860, JP-B-56-17654, JP-B-62-39417, JP-B-62-39418, JP-A-2000-250211 and JP-A-2007-94138, and urethane compounds having a hydrophilic group described in U.S. Pat. No. 7,153,632, JP-T-8-505958, JP-A-2007-293221 and JP-A-2007-293223 are preferably used.

Of the compounds described above, an isocyanuric acid ethyleneoxide-modified acrylate, for example, tris(acryloyloxyethyl) isocyanurate or bis(acryloyloxyethyl) hydroxyethyl isocyanurate is particularly preferred from the standpoint of excellent balance between hydrophilicity relating to the on-press development property and polymerization ability relating to the printing durability.

Details of the method of using the polymerizable compound, for example, the structure, the type of usage (for example, individual use or combination use of two or more kinds) or the addition amount can be appropriately determined in accordance with the characteristic design of the final lithographic printing plate precursor. The polymerizable compound is used preferably in a range from 5 to 75% by weight, more preferably in a range from 7 to 70% by weight, particularly preferably in a range from 10 to 60% by weight, based on the total solid content of the image-recording layer.

[Polysaccharide Having Sulfonic Acid Group or Group Made by Salt Thereof]

(Sulfonic Acid Group or Group Made by Salt Thereof)

The polysaccharide having a sulfonic acid group or a group made by a salt thereof preferably has a structure represented by formula (A) shown below:

$$—O-L-SO_3^-X^+ \qquad \text{Formula (A)}$$

wherein L represents an ethylene group or a propylene group, $X^+$ represents a hydrogen ion, an alkali metal ion or an ammonium ion.

As the alkali metal ion, for example, a lithium ion, a sodium ion and a potassium ion are exemplified. The ammonium ion includes an inorganic ammonium ion and an organic ammonium ion. As the organic ammonium ion, for example, $NH_3(R1)^+$, $NH_2(R1)(R2)^+$, $NH(R1)(R2)(R3)^+$ and $N(R1)(R2)(R3)(R4)^+$ are exemplified. R1 to R4 each independently represents an alkyl group having from 1 to 6 carbon atoms.

(Polysaccharide)

Examples of the skeleton of the polysaccharide in the polysaccharide having a sulfonic acid group or a group made by a salt thereof include that has glucose as a sugar unit, for example, dextrin, starch, cellulose, glucan or glycogenpullulan; that has fructose as a sugar unit, for example, inulin, levan or fructooligosaccharide; that has N-acetylglucosamine as a sugar unit, for example, chitin; that has galactose as a sugar unit, for example, galactooligosaccharide; and that has mannose as a sugar unit, for example, mannan oligosaccharide. The polysaccharide may be a polysaccharide composed of two or more sugar units, and examples of the skeleton of the polysaccharide include raffinose and stachyose (galactose/fructose/glucose). Among them, dextrin, starch, cellulose, glucan or glycogenpullulan is preferred, and cellulose is particularly preferred.

Specifically, the polysaccharide having a sulfonic acid group or a group made by a salt thereof is preferably cellulose having a repeating unit represented by formula (1) shown below:

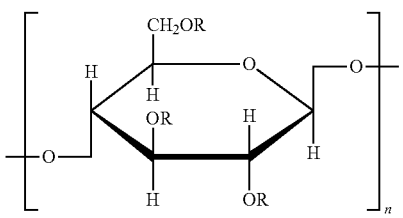
Formula (1)

wherein R each independently represents a hydrogen atom, an alkyl group, a hydroxyalkyl group, a carboxyalkyl group or $-L-SO_3^-X^+$, n represents an integer of 2 or more, and L and $X^+$ have the same meanings as L and $X^+$ in formula (A), provided that of three Rs in the repeating unit represented by formula (1), a number (substitution degree) of R represented by $-L-SO_3^-X^+$ is from 0.3 to 2.5.

The term "substitution degree" in the specification means an average number of substituents with which hydrogen atoms of hydroxy groups are modified per monosaccharide (that is, corresponding to the repeating unit described above) of the polysaccharide, and, for example, when all of the hydrogen atoms of hydroxy groups of cellulose are modified, the substitution degree is 3.

The number (substitution degree) of R represented by $-L-SO_3^-X^+$ is more preferably from 0.35 to 2, and still more preferably from 0.4 to 1.2.

n is preferably from 6 to 3,000.

The alkyl group for R include, for example, a methyl group and an ethyl group.

The hydroxyalkyl group for R include, for example, a hydroxypropyl group and a hydroxyethyl group.

The carboxyalkyl group for R include, for example, a carboxymethyl group.

(Synthesis Method)

As the synthesis method of the polysaccharide having a sulfonic acid group or a group made by a salt thereof, a method based on sulfonation of cellulose as described, for example, in JP-A-9-227601, and also, a method of reacting a polysaccharide, for example, cellulose, with a sulfoalkylating agent, for example, vinyl sulfonic acid or a metal salt thereof, β-chloroethane sulfonic acid or a metal salt thereof, butanesultone or propanesultone are exemplified.

As a structure of an adduct having a sulfonic acid group or a group made by a salt thereof, which is reacted with a polysaccharide as a mother skeleton, a compound having a sulfonic acid group or a group made by a salt thereof at one terminal and a halogen atom (for example, F, Cl, Br or I) at the other terminal is preferred, and a compound represented by formula (I) shown below is more preferred.

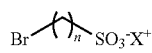 (I)

$X^+$ has the same meaning as $X^+$ in formula (A), and n represents an integer from 1 to 10.

Specific examples of $X^+$ are same as those described for $X^+$ in formula (A).

n is preferably 2 or 3.

As a structure of the adduct having a sulfonic acid group or a group made by a salt thereof, which is reacted with a polysaccharide as a mother skeleton, a cyclic compound represented by formula (II) shown below is also preferred.

 (II)

wherein m represents an integer from 1 to 3.

The weight average molecular weight of the polysaccharide having a sulfonic acid group or a group made by a salt thereof is preferably from 1,000 to 50,000, more preferably from 2,000 to 50,000, and still more preferably from 3,000 to 30,000.

In the invention, the weight average molecular weight can be measured by an ordinary method using GPC (gel permeation chromatography).

The content of the polysaccharide having a sulfonic acid group or a group made by a salt thereof is preferably from 0.5 to 40% by weight, more preferably from 1 to 30% by weight, still more preferably from 2 to 25% by weight, based on the total solid content constituting the image-recording layer.

[Binder Polymer]

The image-recording layer according to the invention ordinarily contains a binder polymer in order to impart a film-forming property. As the binder polymer which can be used in the invention, heretofore known binder polymers can be used without limitation as long as it can impart the film-forming property. It may be a straight-chain binder polymer or a star-like polymer as described in JP-A-2007-249036. For example, an addition polymer and a urethane resin having a crosslinkable group in its side chain described below for the lithographic printing plate precursor are preferably exemplified.

According to the invention, the image-recording layer is an image-recording layer capable of forming an image by supplying at least any of printing ink and dampening water on a printing machine to remove an unexposed area thereof.

As the binder polymer capable of being incorporated into the image-recording layer, a binder polymer having an alkylene oxide group is preferred.

The binder polymer having an alkylene oxide group for use in the image-recording layer of the lithographic printing plate precursor according to the invention may have a poly(alkylene oxide) moiety in the main chain thereof or in the side chain thereof, or may be a graft polymer having a poly(alkylene oxide) in its side chain or a block copolymer composed of a block constituted by a repeating unit containing a poly(alkylene oxide) and a block constituted by a repeating unit not containing an (alkylene oxide).

In the case where the alkylene oxide group is present in the main chain, a polyurethane resin is preferred. In the case where the alkylene oxide group is present in the side chain, a polymer constituting its main chain includes an acrylic resin, a polyvinyl acetal resin, a polyurethane resin, a polyurea resin, a polyimide resin, a polyimide resin, an epoxy resin, a methacrylic resin, a polystyrene resin, a novolac type phenolic resin, a polyester resin, a synthesis rubber and a natural rubber. In particular, an acrylic resin is preferred.

The alkylene oxide is preferably an alkylene oxide having from 2 to 6 carbon atoms, and particularly preferably an ethylene oxide or a propylene oxide.

A repeating number of alkylene oxide in the poly(alkylene oxide) moiety is from 2 to 120, preferably in a range from 2 to 70, and more preferably in a range from 2 to 50.

It is preferred that the repeating number of alkylene oxide is 120 or less because both the printing durability as to abrasion and the printing durability as to ink receptivity are not decreased.

The poly(alkylene oxide) moiety is preferably introduced into an side chain of the binder as a structure represented by formula (a) shown below. More preferably, it is introduced into a side chain of an acrylic resin as a structure represented by formula (a) shown below.

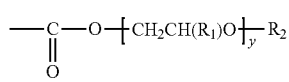

Formula (a)

In formula (a), y represents a number from 2 to 120, preferably in a range from 2 to 70, and more preferably in a range from 2 to 50. $R_1$ represents a hydrogen atom or an alkyl group. $R_2$ represents a hydrogen atom or an organic group. The organic group is preferably an alkyl group having from 1 to 6 carbon atoms and includes a methyl group, an ethyl group, an n-propyl group, an isopropyl group, an n-butyl group, a sec-butyl group, an isobutyl group, a tert-butyl group, an n-pentyl group, an isopentyl group, a neopentyl group, an n-hexyl group, an isohexyl group, a 1,1-dimethylbutyl group, a 2,2-dimethylbutyl group, a cyclopentyl group and a cyclohexyl group.

In formula (a), $R_1$ is preferably a hydrogen atom or a methyl group and most preferably a hydrogen atom. $R_2$ is most preferably a hydrogen atom or a methyl group.

The binder polymer may have a crosslinking property in order to improve the film strength of the image area. In order to impart the crosslinking property to the binder polymer, a crosslinkable functional group, for example, an ethylenically unsaturated bond is introduced into a main chain or side chain of the polymer. The crosslinkable functional group may be introduced by copolymerization.

Examples of the polymer having an ethylenically unsaturated bond in the main chain thereof include poly-1,4-butadiene and poly-1,4-isoprene.

Examples of the polymer having an ethylenically unsaturated bond in the side chain thereof include a polymer of an ester or amide of acrylic acid or methacrylic acid, which is a polymer wherein the ester or amido residue (R in —COOR or —CONHR) has an ethylenically unsaturated bond.

Examples of the residue (R described above) having an ethylenically unsaturated bond include —(CH$_2$)$_n$CR$^1$=CR$^2$R$^3$, —(CH$_2$O)$_n$CH$_2$CR$^1$=CR$^2$R$^3$, —(CH$_2$CH$_2$O)$_n$CH$_2$CR$^1$=CR$^2$R$^3$, —(CH$_2$)—NH—CO—O—CH$_2$CR$^1$=CR$^2$R$^3$, —(CH$_2$)$_n$—O—CO—CR$^1$=CR$^2$R$^3$ and —(CH$_2$CH$_2$O)$_2$—X (wherein R$^1$ to R$^3$ each independently represents a hydrogen atom, a halogen atom or an alkyl group having from 1 to 20 carbon atoms, an aryl group, an alkoxy group or an aryloxy group, or R$^1$ and R$^2$ or R$^1$ and R$^3$ may be combined with each other to form a ring. n represents an integer from 1 to 10. X represents a dicyclopentadienyl residue).

Specific examples of the ester residue include —CH$_2$CH=CH$_2$ (described in JP-B-7-21633), —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$—NHCOO—CH$_2$CH=CH$_2$ and —CH$_2$CH$_2$O—X (wherein X represents a dicyclopentadienyl residue).

Specific examples of the amido residue include —CH$_2$CH=CH$_2$, —CH$_2$CH$_2$—Y (wherein Y represents a cyclohexene residue) and —CH$_2$CH$_2$—OCO—CH=CH$_2$.

The binder polymer having a crosslinking property is cured, for example, by addition of a free radical (a polymerization initiating radical or a growing radical of a polymerizable compound in the process of polymerization) to the crosslinkable functional group of the polymer and undergoing addition polymerization between the polymers directly or through a polymerization chain of the polymerizable compound to form crosslinkage between the polymer molecules. Alternately, it is cured by generation of a polymer radical upon extraction of an atom (for example, a hydrogen atom on a carbon atom adjacent to the functional crosslinkable group) in the polymer by a free radical and connecting the polymer radicals with each other to form cross-linkage between the polymer molecules.

The content of the crosslinkable group (content of the radical polymerizable unsaturated double bond determined by iodine titration) in the binder polymer is preferably from 0.1 to 10.0 mmol, more preferably from 1.0 to 7.0 mmol, most preferably from 2.0 to 5.5 mmol, based on 1 g of the polymer compound. In the range described above, good sensitivity and good preservation stability are obtained.

Specific examples (1) to (13) of the binder polymer for used in the invention are set forth below, but the invention should not be construed as being limited thereto.

In the exemplified compounds described below, a numerical value appended to each repeating unit (numerical value appended to a repeating unit of a main chain) indicates a mole percent of the repeating unit. A numerical value appended to a repeating unit of a side chain indicates a repeating number of the repeating unit.

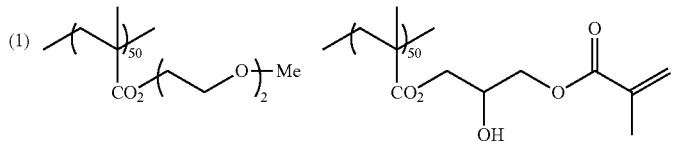

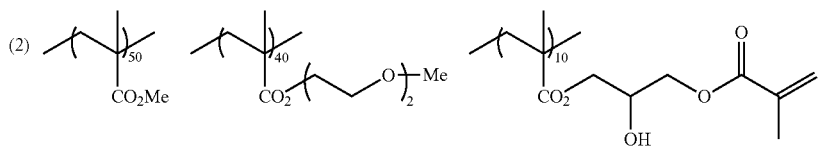

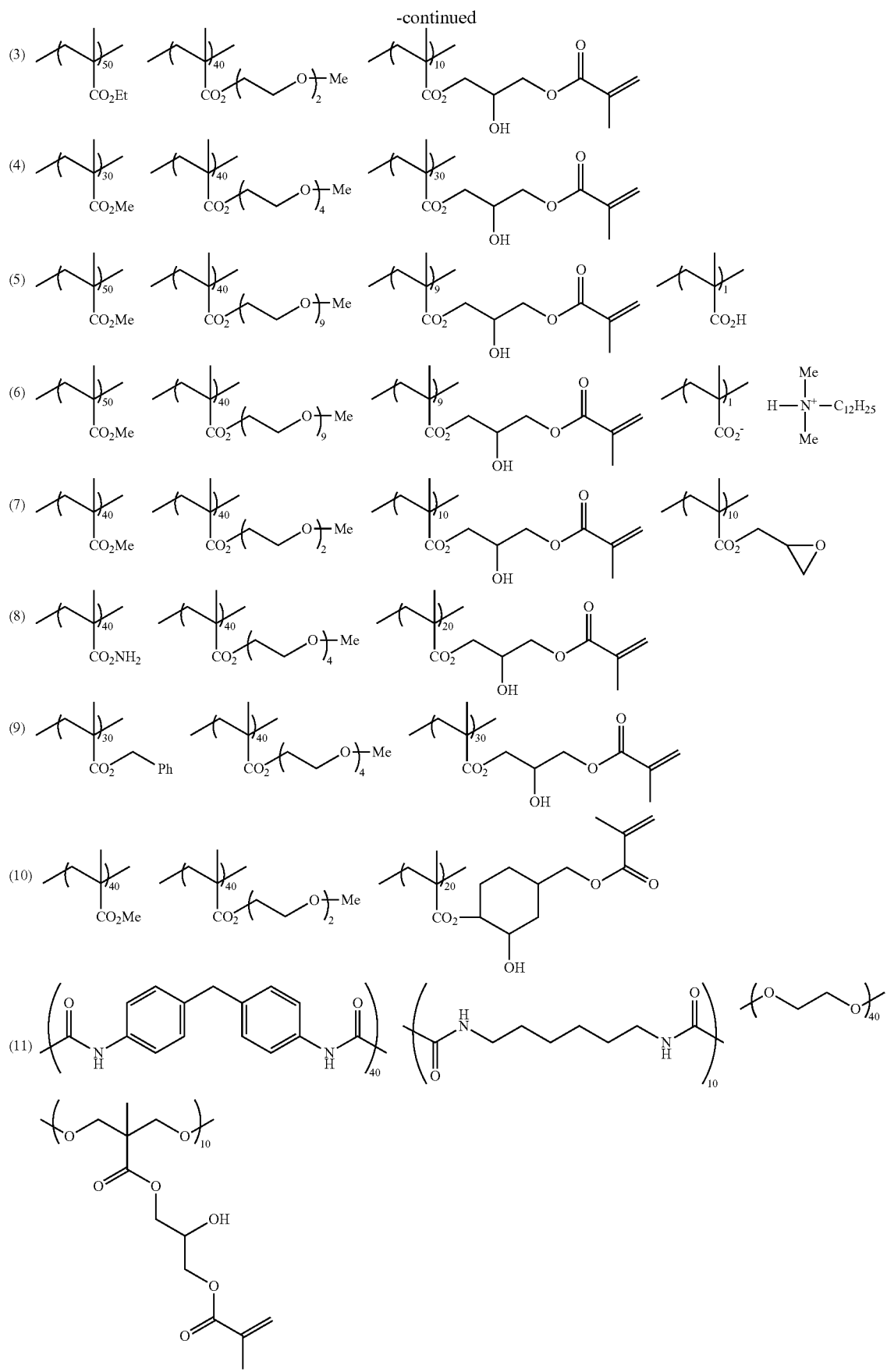

(12)

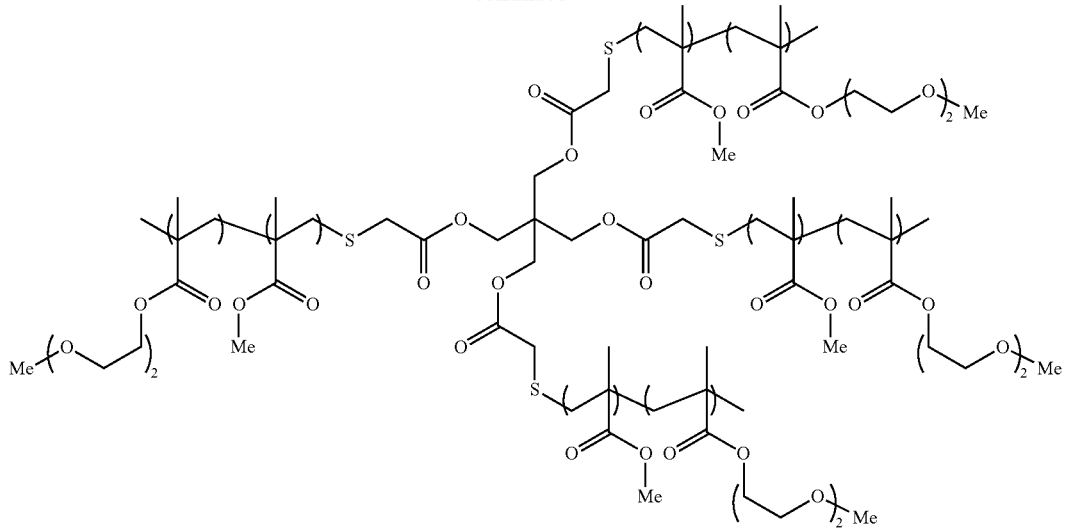

(13)

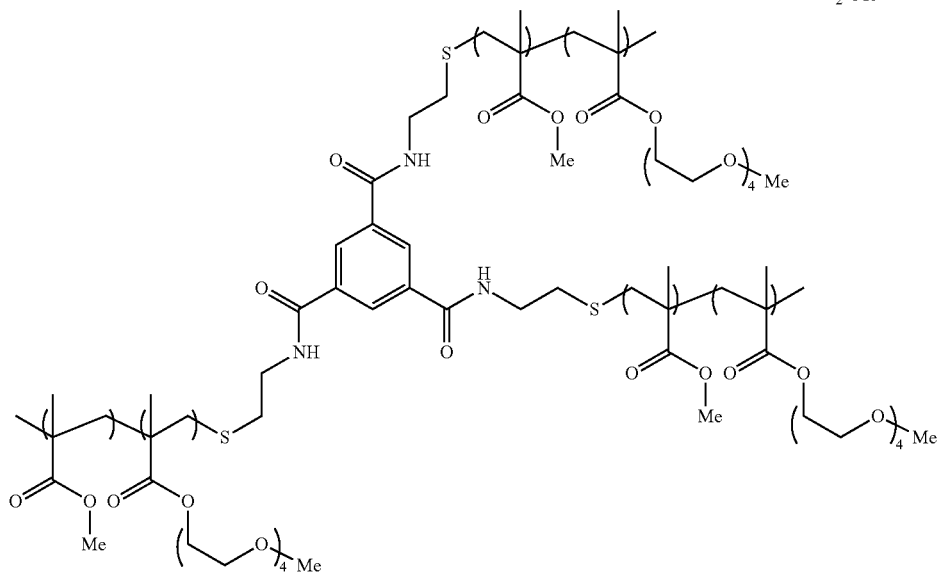

The weight average molecular weight (Mw) of the binder polymer according to the invention is preferably 2,000 or more, more preferably 5,000 or more, and still more preferably from 10,000 to 300,000, in terms of polystyrene measured by GPC method.

According to the invention, a hydrophilic polymer compound, for example, polyacrylic acid or polyvinyl alcohol described in JP-A-2008-195018 may be used together, if desired. Further, an oleophilic polymer compound may be used in combination with a hydrophilic polymer compound.

In the case of applying to the image-recording layer, as to the configuration of the binder polymer, it may be present as a binder acting as a bond of each ingredient or in the form of fine particle in the image-recording. In the case of existing in the form of fine particle, the average particle size thereof is in a range from 10 to 1,000 nm, preferably in a range from 20 to 300 nm, and particularly preferably in a range from 30 to 120 nm.

The content of the binder polymer according to the invention is preferably from 5 to 90% by weight, more preferably from 5 to 80% by weight, still more preferably from 10 to 70% by weight, based on the total solid content of the image-recording layer.

As a preferred combination of the polymerization initiator, the sensitizing dye, the polymerizable compound and the binder polymer, a combination of the respective preferred embodiments thereof is most preferred.

[Components Other than Infrared Absorbing Agent, Polymerization Initiator, Polymerizable Compound, Polysaccharide Having Sulfonic Acid Group or Group Made by Salt Thereof, and Binder Polymer]

[Polymer Fine Particle]

The image-recording layer in the invention can contain a polymer fine particle in order to improve the development property. In particular, a polymer fine particle having a polyalkylene oxide structure is preferred. Among them, a polymer fine particle having a polyalkylene oxide group in its side chain is preferred.

This increases permeability of dampening water to improve the development property. As the polyalkylene oxide structure, an alkylene oxide structure containing from 2 to 120 alkylene oxide units having from 2 to 3 carbon atoms is preferred, and a polyethylene oxide structure containing from 2 to 120 ethylene oxide units is more preferred. Particularly, a polyethylene oxide structure containing from 20 to 100 ethylene oxide units is preferred. By means of such a polymer fine particle containing a polyalkylene oxide structure, compatibility between the printing durability and the development property can be achieved. Also, the ink receptivity can be improved.

The polymer fine particle according to the invention is preferably a hydrophobizing precursor capable of converting the image-recording layer to be hydrophobic when heat is applied. The hydrophobizing precursor polymer fine particle is preferably at least one fine particle selected from a hydrophobic thermoplastic polymer fine particle, a thermo-reactive polymer fine particle, a microcapsule having a hydrophobic compound encapsulated and a microgel (cross-linked polymer fine particle). Among them, a polymer fine particle having a polymerizable group and a microgel are preferred. In order to improve the development property, the polymer fine particle may contain a polyalkylene oxide structure as described above.

As the hydrophobic thermoplastic polymer fine particle, hydrophobic thermoplastic polymer fine particles described, for example, in *Research Disclosure*, No. 33303, January (1992), JP-A-9-123387, JP-A-9-131850, JP-A-9-171249, JP-A-9-171250 and European Patent 931,647 are preferably exemplified.

Specific examples of the polymer constituting the polymer fine particle include a homopolymer or copolymer of a monomer, for example, ethylene, styrene, vinyl chloride, methyl acrylate, ethyl acrylate, methyl methacrylate, ethyl methacrylate, vinylidene chloride, acrylonitrile, vinyl carbazole or an acrylate or methacrylate having a polyalkylene structure and a mixture thereof. Among them, polystyrene, a copolymer containing styrene and acrylonitrile or polymethyl methacrylate is more preferred.

The average particle size of the hydrophobic thermoplastic polymer fine particle for use in the invention is preferably from 0.01 to 2.0 µm.

The thermo-reactive polymer fine particle for use in the invention includes a polymer fine particle having a thermo-reactive group and forms a hydrophobized region by cross-linkage due to thermal reaction and change in the functional group involved therein.

As the thermo-reactive group of the polymer fine particle having a thermo-reactive group for use in the invention, a functional group performing any reaction can be used as long as a chemical bond is formed. For instance, an ethylenically unsaturated group (for example, an acryloyl group, a methacryloyl group, a vinyl group or an allyl group) performing a radical polymerization reaction, a cationic polymerizable group (for example, a vinyl group or a vinyloxy group), an isocyanate group or a blocked form thereof, an epoxy group or a vinyloxy group performing an addition reaction and a functional group having an active hydrogen atom (for example, an amino group, a hydroxy group or a carboxyl group) as the reaction partner thereof; a carboxyl group performing a condensation reaction and a hydroxy group or an amino group as the reaction partner thereof, and an acid anhydride performing a ring opening addition reaction and an amino group or a hydroxy group as the reaction partner thereof are preferably exemplified.

As the microcapsule for use in the invention, microcapsule having all or part of the constituting components of the image-recording layer encapsulated as described, for example, in JP-A-2001-277740, JP-A-2001-277742 and EP 2383118 is exemplified. The constituting components of the image-recording layer may be present outside the microcapsule. It is a preferred embodiment of the image-recording layer containing microcapsule that hydrophobic constituting components are encapsulated in the microcapsule and hydrophilic constituting components are present outside the microcapsule.

The image-recording layer according to the invention may be an embodiment containing a crosslinked resin particle, that is, a microgel. The microgel can contain a part of the constituting components of the image-recording layer inside and/or on the surface thereof. Particularly, an embodiment of a reactive microgel containing the polymerizable compound (B) on the surface thereof is preferred in view of the image-forming sensitivity and printing durability.

As a method of microencapsulation or microgelation of the constituting components of the image-recording layer, known methods can be used.

The average particle size of the microcapsule or microgel is preferably from 0.01 to 3.0 µm, more preferably from 0.05 to 2.0 µm, particularly preferably from 0.10 to 1.0 µm. In the range described above, good resolution and good time-lapse stability can be achieved.

The content of the polymer fine particle is preferably in a range from 5 to 90% by weight based on the total solid content of the image-recording layer.

[Other Components]

The image-recording layer according to the invention may further contain other components described below, if desired.

(Hydrophilic Low Molecular Weight Compound)

The image-recording layer according to the invention may contain a hydrophilic low molecular weight compound in order to improve the on-press development property without accompanying the decrease in the printing durability.

The hydrophilic low molecular weight compound includes a water-soluble organic compound, for example, a glycol, e.g., ethylene glycol, diethylene glycol, triethylene glycol, propylene glycol, dipropylene glycol or tripropylene glycol, or an ether or ester derivative thereof, a polyol, e.g., glycerol, pentaerythritol or tris(2-hydroxyethyl) isocyanurate, an organic amine, e.g., triethanol amine, diethanol amine or monoethanol amine, or a salt thereof, an organic sulfonic acid, e.g., an alkyl sulfonic acid, toluene sulfonic acid or benzene sulfonic acid, or a salt thereof, an organic sulfamic acid, e.g., an alkyl sulfamic acid, or a salt thereof, an organic sulfuric acid, e.g., an alkyl sulfuric acid or an alkyl ether sulfuric acid, or a salt thereof, an organic phosphonic acid, e.g., phenyl phosphonic acid, or a salt thereof, an organic carboxylic acid, e.g., tartaric acid, oxalic acid, citric acid, malic acid, lactic acid, gluconic acid or an amino acid, or a salt thereof and a betaine.

According to the invention, it is preferred that at least one compound selected from a polyol, an organic sulfate, an organic sulfonate and a betaine is incorporated.

Specific examples of the organic sulfonate include an alkylsulfonate, for example, sodium n-butylsulfonate, sodium n-hexylsulfonate, sodium 2-ethylhexylsulfonate, sodium cyclohexylsulfonate or sodium n-octylsulfonate; an alkylsulfonate containing an ethylene oxide chain, for example, sodium 5,8,11-trioxapentadecane-1-sulfonate, sodium 5,8,11-trioxaheptadecane-1-sulfonate, sodium 13-ethyl-5,8,11-trioxaheptadecane-1-sulfonate or sodium 5,8,11,14-tetraoxatetracosane-1-sulfonate; an arylsulfonate, for example, sodium benzenesulfonate, sodium p-toluenesulfonate, sodium p-hydroxybenzenesulfonate, sodium p-styrenesulfonate, sodium isophthalic acid dimethyl-5-sulfonate, sodium 1-naphtylsulfonate, sodium 4-hydroxynaphtylsulfonate, disodium 1,5-naphtyldisulfonate or trisodium 1,3,6-naphtyltrisulfonate; and compounds described in Paragraph Nos. [0026] to [0031] of JP-A-2007-276454 and Paragraph Nos. [0020] to [0047] of JP-A-2009-154525. The salt may also be a potassium salt or a lithium salt.

The organic sulfate includes a sulfate of alkyl, alkenyl, alkynyl, aryl or heterocyclic monoether of polyethylene oxide. The number of ethylene oxide unit is preferably from 1 to 4. The salt is preferably a sodium salt, a potassium salt or a lithium salt. Specific examples thereof include compounds described in Paragraph Nos. [0034] to [0038] of JP-A-2007-276454.

As the betaine, a compound wherein a number of carbon atoms included in a hydrocarbon substituent on the nitrogen atom is from 1 to 5 is preferred. Specific examples thereof include trimethylammonium acetate, dimethylpropylammonium acetate, 3-hydroxy-4-trimethylammoniobutyrate, 4-(1-pyridinio)butyrate, 1-hydroxyethyl-1-imidazolioacetate, trimethylammonium methanesulfonate, dimethylpropylammonium methanesulfonate, 3-trimethylammonio-1-porpanesulfonate and 3-(1-pyridinio)-1-porpanesulfonate.

Since the hydrophilic low molecular weight compound has a small structure of hydrophobic portion and almost no surface active function, degradations of the hydrophobicity and film strength in the image area due to penetration of dampening water into the exposed area (image area) of the image-recording layer are prevented and thus, the ink receptivity and printing durability of the image-recording layer can be preferably maintained.

The addition amount of the hydrophilic low molecular weight compound in the image-recording layer is preferably from 0.5 to 20% by weight, more preferably from 1 to 15% by weight, still more preferably from 2 to 10% by weight, based on the total solid content of the image-recording layer. In the range described above, good on-press development property and good printing durability are achieved.

The hydrophilic low molecular weight compounds may be used individually or as a mixture of two or more thereof.

(Oil-Sensitizing Agent)

In order to improve the ink receptivity, an oil-sensitizing agent, for example, a phosphonium compound, a nitrogen-containing low molecular weight compound or an ammonium group-containing polymer can be used in the image-recording layer according to the invention. In particular, in the case where an inorganic stratiform compound is incorporated into a protective layer, the oil-sensitizing agent functions as a surface covering agent of the inorganic stratiform compound and prevents deterioration of the ink receptivity during printing due to the inorganic stratiform compound.

As preferred examples of the phosphonium compound, phosphonium compounds described in JP-A-2006-297907 and JP-A-2007-50660 are exemplified. Specific examples of the phosphonium compound include tetrabutylphosphonium iodide, butyltriphenylphosphonium bromide, tetraphenylphosphonium bromide, 1,4-bis(triphenylphosphonio)butane di(hexafluorophosphate), 1,7-bis(triphenylphosphonio)heptane sulfate and 1,9-bis(triphenylphosphonio)nonane naphthalene-2,7-disulfonate.

As the nitrogen-containing low molecular weight compound, an amine salt and a quaternary ammonium salt are exemplified. Also, an imidazolinium salt, a benzimidazolinium salt, a pyridinium salt and a quinolinium salt are exemplified. Of the nitrogen-containing low molecular weight compounds, the quaternary ammonium salt and pyridinium salt are preferably used. Specific examples the nitrogen-containing low molecular weight compound include tetramethylammonium hexafluorophosphate, tetrabutylammonium hexafluorophosphate, dodecyltrimethylammonium p-toluenesulfonate, benzyltriethylammonium hexafluorophosphate, benzyldimethyloctylammonium hexafluorophosphate, benzyldimethyldodecylammonium hexafluorophosphate and compounds described in Paragraph Nos. [0021] to [0037] of JP-A-2008-284858 and Paragraph Nos. [0030] to [0057] of JP-A-2009-90645.

The ammonium group-containing polymer may be any polymer containing an ammonium group in its structure and is preferably a polymer containing from 5 to 80% by mole of (meth)acrylate having an ammonium group in its side chain as a copolymerization component. Specific examples thereof include compounds described in Paragraph Nos. [0089] to [0105] of JP-A-2009-208458.

As to the ammonium group-containing polymer, its reduced specific viscosity value (unit: ml/g) determined according to the measuring method described below is preferably in a range from 5 to 120, more preferably in a range from 10 to 110, and particularly preferably in a range from 15 to 100. When the reduced specific viscosity value described above is calculated in terms of weight average molecular weight (Mw) which is in terms of polystyrene measured by GPC method, from 10,000 to 150,000 is preferred, from 17,000 to 140,000 is more preferred, and 20,000 to 130,000 is particularly preferred.

<Measuring Method of Reduced Specific Viscosity>

In a 20 ml measuring flask was weighed 1 g of polymer solid content and the measuring flask is filled up to the gauge line with N-methyl pyrrolidone. The resulting solution was allowed to stand in a thermostatic bath of 30° C. for 30 minutes and put into an Ubbelohde viscometer (viscometer constant: 0.010 cSt/s) and a period for running down of the solution at 30° C. was measured. The measurement was conducted twice for the same sample and an average value of the measurement was determined. The measurement was also conducted for a blank (only N-methyl pyrrolidone) in the same manner. The reduced specific viscosity (ml/g) was calculated according to the formula shown below.

$$\text{Reduced specific viscosity (ml/g)} = \frac{\dfrac{\text{Period for running down of sample solution (sec)} - \text{Period for running down of blank (sec)}}{\text{Period for running down of blank (sec)}}}{\dfrac{3.33 \text{ (g)} \times \dfrac{30}{100}}{20 \text{ (ml)}}}$$

Specific examples of the ammonium group-containing polymer are set forth below.

(1) 2-(Trimethylammonio)ethyl methacrylate p-toluenesulfonate/3,6-dioxaheptyl methacrylate copolymer (molar ratio: 10/90, Mw: 45,000) (2) 2-(Trimethylammonio)ethyl methacrylate hexafluorophosphate/3,6-dioxaheptyl methacrylate copolymer (molar ratio: 20/80, Mw: 60,000) (3) 2-(Ethyldimethylammonio)ethyl methacrylate p-toluenesulfonate/hexyl methacrylate copolymer (molar ratio: 30/70, Mw: 45,000) (4) 2-(Trimethylammonio)ethyl methacrylate hexafluorophosphate/2-ethylhexyl methacrylate copolymer (molar ratio: 20/80, Mw: 60,000) (5) 2-(Trimethylammonio) ethyl methacrylate methylsulfate/hexyl methacrylate copolymer (molar ratio: 40/60, Mw: 70,000) (6) 2-(Butyldimethylammonio)ethyl methacrylate hexafluorophosphate/3,6-dioxaheptyl methacrylate copolymer (molar ratio: 25/75, Mw: 65,000) (7) 2-(Butyldimethylammonio)ethyl acrylate hexafluorophosphate/3,6-dioxaheptyl methacrylate copolymer (molar ratio: 20/80, Mw: 65,000) (8) 2-(Butyldimethylammonio)ethyl methacrylate 13-ethyl-5,8,11-trioxa-1-heptadecanesulfonate/3,6-dioxaheptyl methacrylate copolymer (molar ratio: 20/80, Mw: 75,000) (9) 2-(Butyldimethylammonio)ethyl methacrylate hexafluorophosphate/3,6-dioxaheptyl methacrylate/2-hydroxy-3-methacryloyloxypropyl methacrylate copolymer (molar ratio: 15/80/5, Mw: 65,000)

The content of the oil-sensitizing agent is preferably from 0.01 to 30.0% by weight, more preferably from 0.1 to 15.0% by weight, still more preferably from 1 to 10% by weight, based on the total solid content of the image-recording layer.
(Other Components)

Other components, for example, a surfactant, a coloring agent, a print-out agent, a polymerization inhibitor, a higher fatty acid derivative, a plasticizer, an inorganic fine particle, an inorganic stratiform compound, a sensitizing aid or a chain transfer agent may further be added to the image-recording layer. Specifically, compounds and addition amounts thereof described, for example, in Paragraph Nos. [0114] to [0159] of JP-A-2008-284817, Paragraph Nos. [0023] to [0027] of JP-A-2006-91479 and Paragraph No. [0060] of U.S. Patent Publication No. 2008/0311520 are preferably used.

[Formation of Image-Recording Layer]

The image-recording layer according to the invention is formed by dispersing or dissolving each of the necessary components described above in a known solvent to prepare a coating solution and coating the solution on a support by a known method, for example, bar coater coating and drying as described, for example, in Paragraph Nos. [0142] to [0143] of JP-A-2008-195018. The coating amount (solid content) of the image-recording layer formed on the support after coating and drying may be varied according to the intended purpose but is in general preferably from 0.3 to 3.0 g/m$^2$. In the range described above, good sensitivity and good film property of the image-recording layer can be achieved.

[Undercoat Layer]

In the lithographic printing plate precursor according to the invention, it is preferred to provide an undercoat layer (also referred to as an intermediate layer) between the image-recording layer and the support. The undercoat layer strengthens adhesion between the support and the image-recording layer in the exposed area and makes removal of the image-recording layer from the support easy in the unexposed area, thereby contributing improvement in the development property without accompanying degradation of the printing durability. Further, in the case of infrared laser exposure, since the undercoat layer acts as a heat insulating layer, decrease in sensitivity due to diffusion of heat generated upon the exposure into the support is prevented.

As to a compound for use in the undercoat layer, an undercoat layer containing an acid group, for example, phosphonic acid, phosphoric acid or sulfonic acid is preferably used. Further, a compound having an adsorbing group capable of adsorbing to a surface of support and a crosslinkable group in order to improve an adhesion property to the image-recording layer is preferred. The compound may be a low molecular weight compound or a polymer compound. The compounds may be used in mixture of two or more thereof, if desired.

As the polymer compound, a copolymer of a monomer having an adsorbing group, a monomer having a hydrophilic group and a monomer having a crosslinkable group is preferred. As the adsorbing group capable of adsorbing to a surface of support, a phenolic hydroxy group, a carboxyl group, —PO$_3$H$_2$, —OPO$_3$H$_2$, —CONHSO$_2$—, —SO$_2$NHSO$_2$— or —COCH$_2$COCH$_3$ is preferred. As the hydrophilic group, a sulfo group is preferred. As the crosslinkable group, for example, a methacryl group or an allyl group is preferred. The polymer compound may contain a crosslinkable group introduced by a salt formation between a polar substituent of the polymer compound and a compound containing a substituent having a counter charge to the polar substituent of the polymer compound and an ethylenically unsaturated bond and may also be further copolymerized with a monomer other than those described above, preferably a hydrophilic monomer.

Specifically, a silane coupling agent having an addition-polymerizable ethylenic double bond reactive group described in JP-A-10-282679 and a phosphorus compound having an ethylenic double bond reactive group described in JP-A-2-304441 are preferably exemplified. Low molecular weight compounds or polymer compounds having a crosslinkable group (preferably an ethylenically unsaturated bond group), a functional group capable of interacting with a surface of support and a hydrophilic group described in JP-A-2005-238816, JP-A-2005-125749, JP-A-2006-239867, JP-A-2006-215263 and JP-A-2011-245846 are also preferably used. Polymer compounds having an adsorbing group capable of adsorbing to a surface of support, a hydrophilic group and a crosslinkable group described in JP-A-2005-125749, JP-A-2006-188038 and JP-A-2011-245846 are more preferred.

The content of the unsaturated double bond in the polymer compound for undercoat layer is preferably from 0.1 to 10.0 mmol, most preferably from 0.2 to 5.5 mmol, based on 1 g of the polymer compound.

The weight average molecular weight of the polymer compound for undercoat layer is preferably 5,000 or more, and more preferably from 10,000 to 300,000.

The undercoat layer according to the invention may contain a chelating agent, a secondary or tertiary amine, a polymerization inhibitor or a compound containing an amino group or a functional group having polymerization inhibition ability and a group capable of interacting with a surface of aluminum support (for example, 1,4-diazabicyclo[2,2,2]octane (DABCO), 2,3,5,6-tetrahydroxy-p-quinone, chloranil, sulfophthalic acid, hydroxyethylethylenediaminetriacetic acid, dihydroxyethylethylenediaminediacetic acid or hydroxyethyliminodiacetic acid) in addition to the compound for the undercoat layer described above in order to prevent the occurrence of stain due to the lapse of time.

The undercoat layer is coated according to a known method. The coating amount (solid content) of the undercoat layer is preferably from 0.1 to 100 mg/m$^2$, and more preferably from 1 to 30 mg/m$^2$.
[Support]

As the support for use in the light-sensitive lithographic printing plate precursor according to the invention, a known support is employed. Particularly, an aluminum plate subjected to roughening treatment and anodizing treatment according to a known method is preferred.

Also, an enlarging treatment or a sealing treatment of micropores of the anodized film described in JP-A-2001-253181 and JP-A-2001-322365 or a surface hydrophilizing treatment, for example, with an alkali metal silicate as described in U.S. Pat. Nos. 2,714,066, 3,181,461, 3,280,734 and 3,902,734 or polyvinyl phosphonic acid as described in U.S. Pat. Nos. 3,276,868, 4,153,461 and 4,689,272 may be appropriately selected and applied to the aluminum plate, if desired.

The support preferably has a center line average roughness of 0.10 to 1.2 μm.

The support for use in the lithographic printing plate precursor according to the invention may have a backcoat layer containing an organic polymer compound described in JP-A-5-45885 or an alkoxy compound of silicon described in JP-A-6-35174, provided on the back surface thereof, if desired.

[Protective Layer]

In the lithographic printing plate precursor for use in the method according to the invention, it is preferred to provide a protective layer (an overcoat layer) on the image-recording layer. The protective layer has a function for preventing, for example, occurrence of scratch in the image-recording layer or ablation caused by exposure with high illuminance laser, in addition to the function for restraining an inhibition reaction against the image formation by means of oxygen blocking.

The protective layer in the lithographic printing plate precursor according to the invention may be formed from two or more layers. For example, the protective layer may be constituted from two layer constitution of an upper protective layer and a lower protective layer.

With respect to the protective layer having such properties, there are described, for example, in U.S. Pat. No. 3,458,311 and JP-B-55-49729. As a polymer having low oxygen permeability for use in the protective layer, any water-soluble polymer and water-insoluble polymer can be appropriately selected to use. The polymers may be used in mixture of two or more thereof, if desired. Specifically, for example, polyvinyl alcohol, a modified polyvinyl alcohol, polyvinyl pyrrolidone, a water-soluble cellulose derivative and poly(meth)acrylonitrile are exemplified.

As the modified polyvinyl alcohol, an acid-modified polyvinyl alcohol having a carboxyl group or a sulfo group is preferably used. Specifically, modified polyvinyl alcohols described in JP-A-2005-250216 and JP-A-2006-259137 are preferably exemplified.

In the protective layer, a hydrophilic polymer containing at least a repeating unit represented by formula (1) shown below and a repeating unit represented by formula (2) shown below as described in JP-A-2012-73597 can be used.

In particular, the protective layer preferably contains a hydrophilic polymer containing repeating units represented by formulae (1) and (2) shown below (hereinafter, also referred to as a specific hydrophilic polymer (e)).

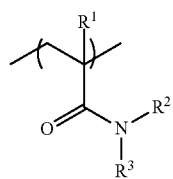

Formula (1)

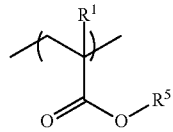

Formula (2)

In formulae (1) and (2), $R^1$ and $R^4$ each independently represents a hydrogen atom or a methyl group. $R^2$ and $R^3$ each independently represents a hydrogen atom, a methyl group or an ethyl group. $R^5$ represents an unsubstituted straight-chain, branched or cyclic alkyl group having from 2 to 8 carbon atoms, a substituted alkyl group which may have an aromatic ring or a heterocyclic ring as a substituent or a substituent represented by formula (3) shown below.

As the substituent which can be introduced into the substituted alkyl group, an aromatic ring group, a heterocyclic group and a polyether group are exemplified.

Formula (3)

In formula (3), L represents an alkylene group having from 2 to 6 carbon atoms, $R^6$ represents a straight-chain, branched or cyclic alkyl group having from 4 to 8 carbon atoms or an aromatic group-substituted alkyl group, and n means an average addition molar number of polyether and represents a number from 2 to 4.

In the repeating unit represented by formula (1), $R^2$ and $R^3$ each preferably represents a hydrogen atom. In the repeating unit represented by formula (2), $R^5$ preferably represents an unsubstituted straight-chain, branched or cyclic alkyl group having from 2 to 8 carbon atoms.

Of the combinations of the repeating units represented by formulae (1) and (2) respectively, a combination where $R^1$ and $R^4$ in formulae (1) and (2) are both hydrogen atoms, $R^2$ and $R^3$ in formula (1) are both hydrogen atoms, and $R^5$ in formula (2) is an unsubstituted branched alkyl group having 4 carbon atoms is most preferred.

The specific hydrophilic polymer (e) is preferably a hydrophilic polymer containing a repeating unit represented by formula (4) shown below.

Formula (4)

In formula (4), $R^7$ represents a hydrogen atom or a methyl group. X represents a single bond, a divalent connecting group selected from structures described in structure group (5) shown below or a divalent connecting group formed by combination of plural structures selected from structures described in structure group (5) shown below. Y represents a carboxylic acid group, a carboxylic acid salt group, a sulfonic acid group, a sulfonic acid salt group, a phosphoric acid group, a phosphoric acid salt group, a phosphonic acid group, a phosphonic acid salt group, a hydroxy group, a carboxybetaine group, a sulfobetaine group, an ammonium group or a polyether group represented by formula (6) shown below.

In the repeating unit represented by formula (4), from the standpoint of water solubility and on-press development property, Y is preferably a sulfonic acid group, a sulfonic acid salt group, a carboxybetaine group, a sulfobetaine group or an ammonium group, and more preferably a sulfonic acid group, a sulfonic acid salt group or a sulfobetaine group.

Also, X is preferably a connecting group containing any of divalent connecting chains selected from structures described in structure group (5) shown below.

Structure group (5)

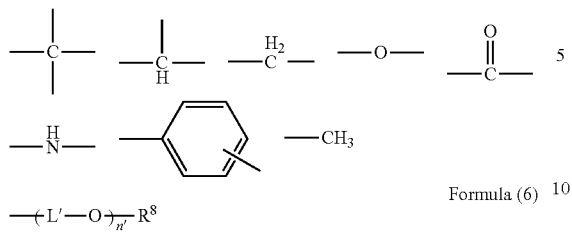

Formula (6)

$$-(L'-O)_{n'}-R^8$$

In formula (6), L' represents an alkylene group having from 2 to 3 carbon atoms. $R^8$ represents a hydrogen atom or a methyl group. n' means an average addition molar number of polyether and represents a number from 2 to 4.

Specific examples of a monomer from which the repeating unit represented by formula (1) is derived include acrylamide, methacrylamide, N-methylacrylamide, N-methylmethacrylamide, N-ethylacrylamide, N-ethylmethacrylamide, N,N-dimethylacrylamide, N,N-dimethylmethacrylamide, N,N-diethylacrylamide, N,N-diethylmethacrylamide, N,N-ethylmethylacrylamide and N,N-ethylmethylmethacrylamide.

Specific examples of a monomer from which the repeating unit represented by formula (2) is derived include methyl acrylate, ethyl acrylate, propyl acrylate, isopropyl acrylate, n-butyl acrylate, isobutyl acrylate, tert-butyl acrylate, pentyl acrylate, hexyl acrylate, cyclohexyl acrylate, heptyl acrylate, octyl acrylate, 2-ethylhexyl acrylate, nonyl acrylate, decyl acrylate, 2-(2-ethylhexyloxyethoxyl)ethyl acrylate, methyl methacrylate, ethyl methacrylate, propyl methacrylate, isopropyl methacrylate, n-butyl methacrylate, isobutyl methacrylate, tert-butyl methacrylate, pentyl methacrylate, hexyl methacrylate, cyclohexyl methacrylate, heptyl methacrylate, octyl methacrylate, 2-ethylhexyl methacrylate, nonyl methacrylate and decyl methacrylate.

The content of the repeating unit represented by formula (1) is preferably from 65 to 96.7% by mole, more preferably from 70 to 80% by mole, particularly preferably from 74 to 80% by mole. The content of the repeating unit represented by formula (2) is preferably from 3 to 30% by mole, more preferably from 20 to 30% by mole, particularly preferably from 20 to 26% by mole.

Specific examples of a monomer from which the repeating unit represented by formula (4) is derived include 2-acryloylamino-2-methylpropanesulfonic acid, sodium 2-acryloylamino-2-methylpropanesulfonate, potassium 2-acryloylamino-2-methylpropanesulfonate, 4-((3-methacrylamidopropyl)dimethylammonio)butane-1-sulfonate, 4-((3-acrylamidopropyl)dimethylammonio)butane-1-sulfonate, vinyl alcohol, acrylic acid, methacrylic acid, sodium styrenesulfonate, diethylene glycol monomethyl ether methacrylate, hydroxyethyl acrylate, hydroxyethyl methacrylate, methacrylcholine chloride, potassium 3-sulfopropylmethacrylate, 2-(methacryloyloxy)ethyl phosphate, dimethyl-N-methacryloyloxyethyl-N-carboxymethyl-ammonium betaine and vinylphosphonic acid.

The specific hydrophilic polymer (e) contains the repeating unit represented by formula (4) preferably in a range from 0.3 to 5% by mole, more preferably from 0.3 to 3% by mole, and still more preferably from 0.3 to 1.5% by mole.

By incorporating the repeating unit represented by formula (4) into the hydrophilic polymer used in the protective layer according to the invention in the preferred range described above, the light-sensitive lithographic printing plate precursor for use in the invention provides good on-press development property, ink receptivity and printing durability.

The weight average molecular weight (Mw) in terms of polystyrene measured by GPC method of the hydrophilic polymer according to the invention is preferably in a range from 10,000 to 200,000, more preferably in a range from 10,000 to 100,000, and most preferably in a range from 10,000 to 30,000.

Specific examples of the hydrophilic polymer according to the invention are set forth below. The ratio of the respective repeating units is recited as mole fraction, and Mw of the hydrophilic polymer is each 20,000.

The content of the specific hydrophilic polymer (e) in the protective layer is preferably 40% by weight or more, more preferably from 60% by weight or more, particularly preferably from 80% by weight or more, based on the solid content of the protective layer. In the range described above, a lithographic printing plate having better ink receptivity and higher printing durability is provided and a lithographic printing plate precursor more excellent in on-press development property is obtained.

1

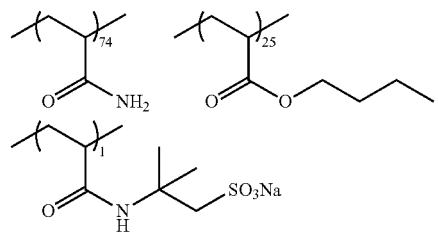

2

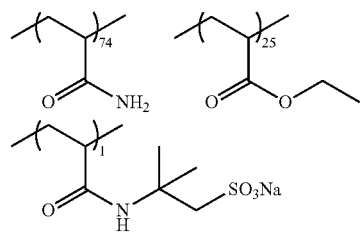

3

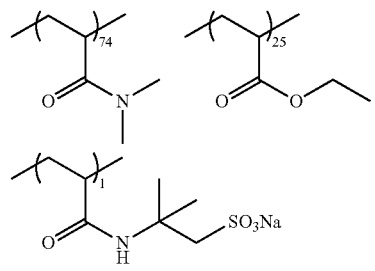

4

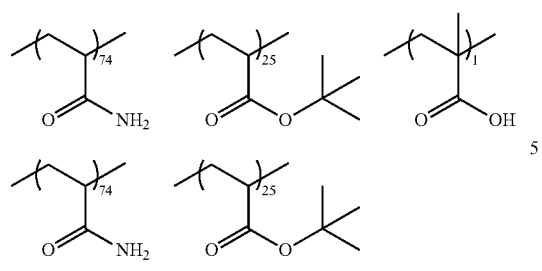

5

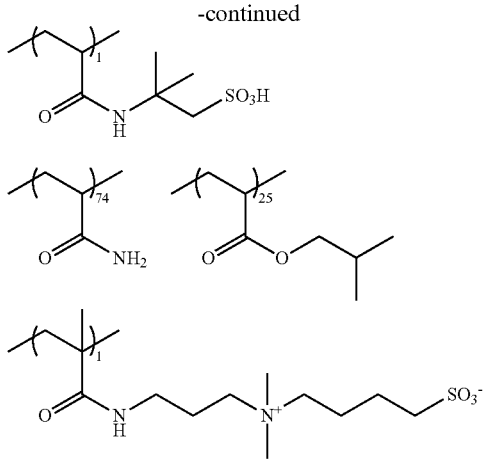

Also, the protective layer preferably contains a stratiform compound which is inorganic (called also as "an inorganic stratiform compound"), for example, natural mica or synthetic mica, as described in JP-A-2005-119273 in order to increase the oxygen blocking property.

Further, the protective layer may contain known additives, for example, a plasticizer for imparting flexibility, a surfactant for improving coating property, an inorganic fine particle for controlling a surface slipping property or an ultraviolet absorbing agent. Moreover, the oil-sensitizing agent described with respect to the image-recording layer may also be incorporated into the protective layer.

The adhesion property to the image-recording layer and scratch resistance are also extremely important in view of handling of the lithographic printing plate precursor. Specifically, when a hydrophilic protective layer containing a water-soluble polymer as the main component is stacked on the oleophilic image-recording layer, layer peeling due to an insufficient adhesion property is liable to occur, and the peeled portion causes such a defect as failure in curing of the image-recording layer due to polymerization inhibition by oxygen. Various proposals have been made for improving the adhesion property between two layers. For example, it is described in JP-B-54-12215 and BP-A-1303578 that a sufficient adhesion property can be obtained by mixing from 20 to 60% by weight of an acryl emulsion or a water-insoluble vinyl pyrrolidone/vinyl acetate copolymer in the protective layer. Any of these known techniques can be applied to the protective layer according to the invention.

As to a coating method of the protective layer, known methods described, for example, in U.S. Pat. No. 3,458,311 and JP-B-55-49729 can be applied. The coating amount of the protective layer is preferably in a range from 0.01 to 10 g/m$^2$, more preferably in a range from 0.02 to 3 g/m$^2$, most preferably in a range from 0.02 to 1 g/m$^2$, in terms of the coating amount after drying.

Thus, a light-sensitive lithographic printing plate precursor applied to the method according to the invention can be obtained.

[Plate Making Method]

The plate making method of the lithographic printing plate according to the invention includes at least a process of image exposure of the lithographic printing plate precursor (hereinafter, also referred to as an "exposure process") and a process of conducting development processing with at least one of oily ink and an aqueous composition (hereinafter, also referred to as a "development process").

<Exposure Process>

The lithographic printing plate precursor for use in the invention is preferably exposed using a light source of wavelength from 750 to 1,400 nm. As such a light source, a solid laser or semiconductor laser emitting an infrared ray is preferably used, and in particular, a method of image exposure by conducting scanning exposure with such an infrared laser is preferred. The exposure mechanism may be any of an internal drum system, an external drum system and a flatbed system.

<Development Process>

It is preferred that after the image exposure, the lithographic printing plate precursor for use in the invention is mounted on a printing machine (more specifically, a cylinder of printing machine) and developed by removing the unexposed area of the image-recording layer with at least one of oily ink and an aqueous component (on-press development).

The on-press development method includes a process in which the lithographic printing plate precursor is imagewise exposed and a printing process in which at least one of oily ink and an aqueous component is supplied to the exposed lithographic printing plate precursor without undergoing any development processing to perform printing, and it is characterized in that the unexposed area of the lithographic printing plate precursor is removed in the course of the printing process. The imagewise exposure may be performed on a printing machine after the lithographic printing plate precursor is mounted on the printing machine or may be separately performed using a platesetter or the like. In the latter case, the exposed lithographic printing plate precursor is mounted as it is on a printing machine without undergoing a development processing process. Then, the printing operation is initiated using the printing machine with supplying at least one of oily ink and an aqueous component and at an early stage of the printing the on-press development is carried out. Specifically, the image-recording layer in the unexposed area is removed and the hydrophilic surface of support is revealed therewith to form the non-image area. As the oily ink and the aqueous component, printing ink and dampening water for conventional lithographic printing can be employed, respectively.

While either the dampening water or printing ink may be supplied at first on the surface of lithographic printing plate precursor, it is preferred to supply the printing ink at first in view of preventing the dampening water from contamination with the component of the image-recording layer removed.

Thus, the lithographic printing plate precursor according to the invention is subjected to the on-press development on an offset printing machine and used as it is for printing a large number of sheets.

Also, the development process is able to be conducted by development with an aqueous solution containing a surfactant utilizing an automatic development machine. The aqueous solution may contain a water-soluble resin.

Further, in the plate making process of preparing a lithographic printing plate from the lithographic printing plate precursor according to the invention, the lithographic printing plate precursor may be heated its entire surface before or during the exposure or between the exposure and the development, if desired. By the heating, the image-forming reaction in the image-recording layer is accelerated and advantages, for example, improvement in the sensitivity and printing durability and stabilization of the sensitivity are achieved. For the purpose of increasing the image strength and printing durability, it is also effective to perform entire surface after-heating or entire surface exposure of the image after the development. Ordinarily, the heating before the development is preferably performed under a mild condition of 150° C. or lower. When the temperature is too high, a problem may arise sometimes in that the unexposed area is also cured. In the heating after the development, very strong conditions are utilized. Ordinarily, the temperature is in a range from 100 to 500° C. When the temperature is too low, a sufficient effect of strengthening the image may not be obtained, whereas when it is excessively high, problems of deterioration of the support and thermal decomposition of the image area may occur sometimes.

EXAMPLES

The invention will be described in more detail with reference to the following examples, but the invention should not be construed as being limited thereto. With respect to the polymer compounds used in the examples, unless otherwise particularly defined, a molecular weight means a weight average molecular weight (Mw) calculated in terms of polystyrene measured by GPC method and a ratio of repeating units is indicated in mole percent.

[Synthesis Example of Modified Cellulose]

Formulation: Into a flask equipped with a stirring device and a cooling pipe were put 10.0 g of cellulose, 1.2 g of sodium hydroxide and 35.5 g of N-ethylpyrrolidone, and the inner temperature was set to 90° C. Then, 4.0 g of butane-sultone was added dropwise while taking care of temperature rise, and after the dropwise addition the mixture was reacted under stirring at 90° C. for 12 hours to synthesis a modified cellulose described in Table 1 below for use in Example 1.

Modified celluloses for use in other examples were synthesized according to the same procedure.

Examples 1 to 5

1. Production of Lithographic Printing Plate Precursor (1) Production of Support An aluminum plate (material: JIS A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm, followed by thorough washing with water. The plate was subjected to etching by immersing in 25% by weight aqueous sodium hydroxide of 45° C. for 9 seconds, washed with water, then immersed in a 20% by weight nitric acid solution at 60° C. for 20 seconds, and washed with water. The etching amount of the grained surface was about 3 g/m$^2$.

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current, and 5% of the electric current flowing from the electric source was divided to the auxiliary anode. The quantity of electricity in the nitric acid electrolysis was 175 C/dm$^2$ in terms of the quantity of electricity when the aluminum plate functioned as an anode. The plate was then washed with water by spraying.

The plate was further subjected to an electrochemical roughening treatment in the same manner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying.

The plate was then subjected to an anodizing treatment using as an electrolytic solution, 15% by weight sulfuric acid (containing 0.5% by weight of aluminum ion) at a current density of 15 A/dm$^2$ to form a direct current anodized film of 2.5 g/m$^2$, washed with water and dried to produce Support (1).

Thereafter, in order to ensure the hydrophilicity of the non-image area, Support (1) was subjected to silicate treatment using a 2.5% by weight aqueous sodium silicate No. 3 solution at 60° C. for 10 seconds and then was washed with water to obtain Support (2). The adhesion amount of Si was 10 mg/m$^2$. The center line average roughness (Ra) of the support was measured using a stylus having a diameter of 2 μm and found to be 0.51 μm.

(2) Formation of Undercoat Layer

Coating solution (1) for undercoat layer shown below was coated on Support (2) described above so as to have a dry coating amount of 20 mg/m$^2$ to produce a support having an undercoat layer for use in the experiments described below.

<Coating Solution (1) for Undercoat Layer>

| | |
|---|---|
| Compound (1) for undercoat layer having structure shown below | 0.18 g |
| Hydroxyethyliminodiacetic acid | 0.10 g |
| Methanol | 55.24 g |
| Water | 6.15 g |

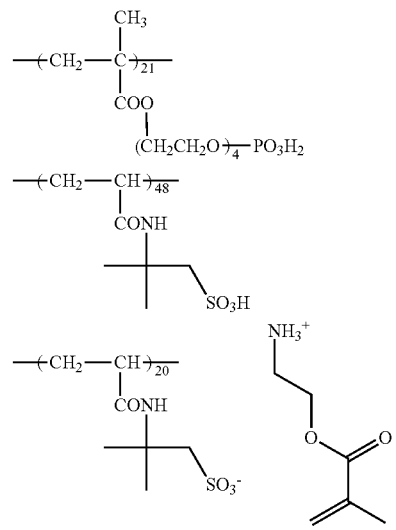

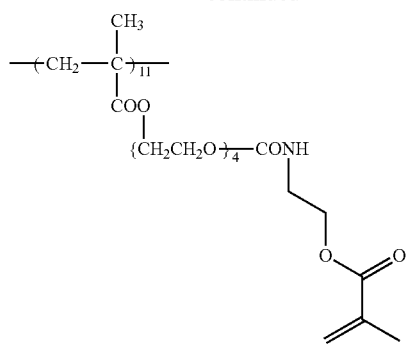

Compound (1) for undercoat layer
(Mw: 100,000)

(3) Formation of Image-Recording Layer

Coating solution (1) for image-recording layer having the composition shown below was coated on the undercoat layer formed as described above by a bar and dried in an oven at 100° C. for 60 seconds to form an image-recording layer having a dry coating amount of 1.0 g/m².

Coating solution (1) for image-recording layer was prepared by mixing Photosensitive solution (1) shown below with Microgel solution (1) shown below just before the coating, followed by stirring.

<Photosensitive Solution (1)>

| | |
|---|---|
| Binder polymer (1) having structure shown below | 0.240 g |
| Infrared absorbing agent (1) having structure shown below | 0.030 g |
| Radical generator (1) having structure shown below) | 0.162 g |
| Polymerizable compound | 0.192 g |
| Tris(acryloyloxyethyl) isocyanurate (NK ESTER A-9300, produced by Shin-Nakamura Chemical Co., Ltd.) | |
| Hydrophilic low molecular weight compound | 0.062 g |
| Tris(2-hydroxyethyl) isocyanurate | |
| Hydrophilic low molecular weight compound (1) having structure shown below | 0.050 g |
| Oil-sensitizing agent (Phosphonium compound (1) having structure shown below) | 0.055 g |
| Oil-sensitizing agent | 0.018 g |
| Benzyl dimethyl octyl ammonium $PF_6$ salt | |
| Oil-sensitizing agent (Ammonium group-containing polymer having structure shown below (reduced specific viscosity: 44 cSt/g/ml)) | 0.035 g |
| Fluorine-based surfactant (1) having structure shown below | 0.008 g |
| 2-Butanone | 1.091 g |
| 1-Methoxy-2-propanol | 8.609 g |
| Organic borate (A) having structure shown below | 0.25 g |
| Sulfonic acid-modified cellulose shown in Table 1 | 0.30 g |

<Microgel Solution (1)>

| | |
|---|---|
| Microgel (1) | 2.640 g |
| Distilled water | 2.425 g |

The structures of Binder polymer (1), Infrared absorbing agent (1), Radical generator (1), Phosphonium compound (1), Hydrophilic low molecular weight compound (1), Ammonium group-containing polymer, Fluorine-based surfactant (1) and Organic borate (A) described above are as shown below.

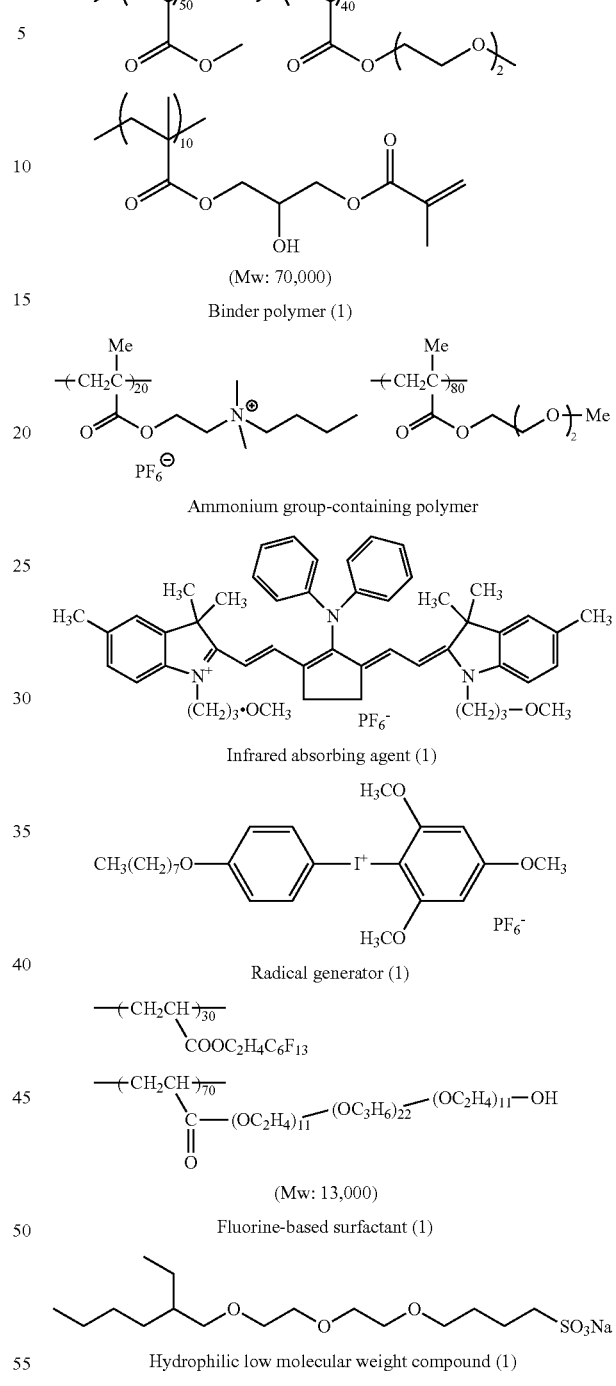

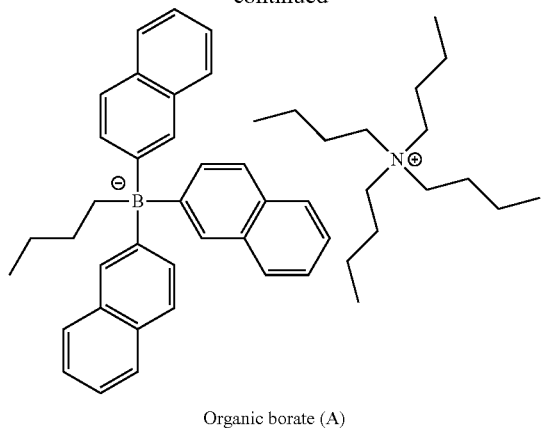

Organic borate (A)

—Synthesis of Microgel (1)—
<Synthesis of Microgel>

An oil phase component was prepared by dissolving 10 g of adduct of trimethylolpropane and xylene diisocyanate (TAKENATE D-110N, produced by Mitsui Chemicals Inc.), 3.15 g of pentaerythritol triacrylate (SR444, produced by Nippon Kayaku Co., Ltd.) and 0.1 g of an alkylbenzenesulfonate (PIONIN A-41C, produced by Takemoto Oil & Fat Co., Ltd.) in 17 g of ethyl acetate. As an aqueous phase component, 40 g of an aqueous 4% by weight solution of polyvinyl alcohol (PVA-205, produced by Kuraray Co., Ltd) was prepared. The oil phase component and the aqueous phase component were mixed and the mixture was emulsified using a homogenizer at 12,000 rpm for 10 minutes. The resulting emulsion was added to 25 g of distilled water and stirred at room temperature for 30 minutes and then at 50° C. for 3 hours. The microgel liquid thus-obtained was diluted using distilled water so as to have the solid content concentration of 15% by weight to prepare the microgel. The average particle size of the microgel was measured by a light scattering method and found to be 0.2 µm.

<Formation of Protective Layer>

Coating solution (1) for protective layer having the composition shown below was further coated on the image-recording layer of lithographic printing plate precursor by a bar and dried in an oven at 120° C. for 60 seconds to form a protective layer having a dry coating amount of 0.15 g/m², thereby preparing lithographic printing plate precursors for Examples 1 to 5, respectively.

<Coating Solution (1) for Protective Layer>

| | |
|---|---|
| Dispersion of inorganic stratiform compound (1) | 1.5 g |
| Aqueous 6% by weight solution of polyvinyl alcohol (CKS 50, sulfonic acid-modified, saponification degree: 99% by mole or more, polymerization degree: 300, produced by Nippon Synthetic Chemical Industry Co., Ltd.) | 0.55 g |
| Aqueous 6% by weight solution of polyvinyl alcohol (PVA-405, saponification degree: 81.5% by mole, polymerization degree: 500, produced by Kuraray Co., Ltd.) | 0.03 g |
| Aqueous 1% by weight solution of surfactant (EMALEX 710, produced by Nihon Emulsion Co., Ltd.) | 0.86 g |
| Ion-exchanged water | 6.0 g |

(Preparation of Dispersion of Inorganic Stratiform Compound (1))

To 193.6 g of ion-exchanged water was added 6.4 g of synthetic mica (SOMASIF ME-100, produced by CO-OP Chemical Co., Ltd.) and the mixture was dispersed using a homogenizer until an average particle size (according to a laser scattering method) became 3 µm. The aspect ratio of the particle thus-dispersed was 100 or more.

Comparative Example 1

A lithographic printing plate precursor for Comparative Example 1 was obtained by preparing in the same manner as in Example 1 except for using the same weight of ethyl cellulose shown in Table 1 in place of the sulfonic acid-modified cellulose.

Comparative Example 2

A lithographic printing plate precursor for Comparative Example 2 was obtained by preparing in the same manner as in Example 1 except for replacing 0.30 g of the sulfonic acid-modified cellulose with 0.30 g of Binder polymer (1) described above.

Examples 6 to 18

Photosensitive solution (2) shown below was coated on Support (2) described above based on the method described in the formation of image-recording layer in Example 1 to obtain lithographic printing plate precursors for Examples 6 to 18 having an image-forming layer having a dry coating amount of 1.0 g/m², respectively.

<Photosensitive Solution (2)>

| | |
|---|---|
| Aqueous dispersion (1) of polymer fine particle | 20.0 g |
| Infrared absorbing agent (2) having structure shown below | 0.2 g |
| Radical generator (IRGACURE 250, produced by BASF) | 0.5 g |
| Sulfonic acid-modified cellulose shown in Table 1 | 0.3 g |
| Organic borate (A) having structure shown above | 0.25 g |
| Polymerizable compound (SR-399, produced by Sartomer Co.) | 1.50 g |
| Mercapto-3-triazole | 0.2 g |
| BYK 336 (produced by BYK-Chimie GmbH) | 0.4 g |
| ELVACITE 4026 (produced by Ineos Acrylica Inc.) | 2.5 g |
| n-Propanol | 55.0 g |
| 2-Butanone | 17.0 g |

The compounds indicated using their trade names in the composition described above are as shown below.

IRGACURE 250: (4-Methoxyphenyl)[4-(2-methylpropyl)phenyl]iodonium hexafluorophosphate (75% by weight propylene carbonate solution)

SR-399: Dipentaerythritol pentaacrylate

BYK 336: Modified dimethylpolysiloxane copolymer (25% by weight xylene/methoxypropyl acetate solution)

ELVACITE 4026: Highly branched polymethyl methacrylate (10% by weight 2-butanone solution)

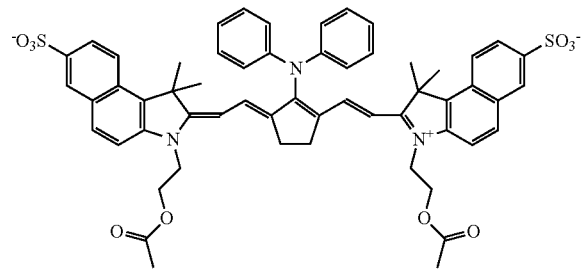

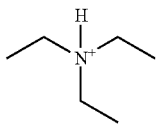

Infrared absorbing agent (2)

(Preparation of Aqueous Dispersion (1) of Polymer Fine Particle)

A stirrer, a thermometer, a dropping funnel, a nitrogen inlet tube and a reflux condenser were attached to a 1,000 ml four-neck flask and while carrying out deoxygenation by introduction of nitrogen gas, 10 g of polyethylene glycol methyl ether methacrylate (PEGMA, average repeating unit number of ethylene glycol: 50), 200 g of distilled water and 200 g of n-propanol were charged therein and heated until the internal temperature reached 70° C. Then, a mixture of 10 g of styrene (St), 80 g of acrylonitrile (AN) and 0.8 g of 2,2'-azobisisobutyronitrile previously prepared was dropwise added to the flask over a period of one hour. After the completion of the dropwise addition, the mixture was continued to react as it was for 5 hours. Then, 0.4 g of 2,2'-azobisisobutyronitrile was added and the internal temperature was raised to 80° C. Thereafter, 0.5 g of 2,2'-azobisisobutyronitrile was added over a period of 6 hours. At the stage after reacting for 20 hours in total, the polymerization proceeded 98% or more to obtain Aqueous dispersion (1) of polymer fine particle of PEGMA/St/AN (10/10/80 in a weight ratio). The particle size distribution of the polymer fine particle had the maximum value at the particle size of 150 nm.

The particle size distribution was determined by taking an electron microphotograph of the polymer fine particle, measuring particle sizes of 5,000 fine particles in total on the photograph, and dividing a range from the largest value of the particle size measured to 0 on a logarithmic scale into 50 parts to obtain occurrence frequency of each particle size by plotting. With respect to the aspherical particle, a particle size of a spherical particle having a particle area equivalent to the particle area of the aspherical particle on the photograph was defined as the particle size.

Examples 19 and 20

Lithographic printing plate precursors for Examples 19 and 20 were obtained by preparing in the same manner as in Example 6 except for using sulfonated polysaccharides (see the structures shown below, in the formulae below n represents a repeating number of the repeating unit enclosed in brackets), shown in Table 1 in place of the sulfonic acid-modified cellulose, respectively.

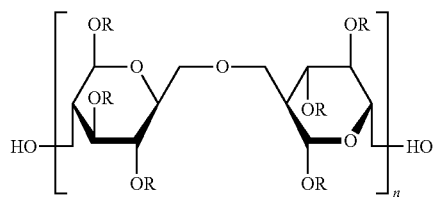

Starch ethyl sulfonate
R= H or CH2CH2SO3Na

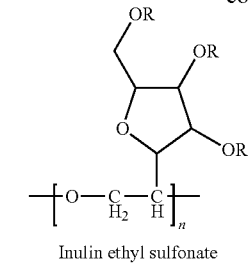

Inulin ethyl sulfonate
R= H or CH2CH2SO3Na

Comparative Example 3

A lithographic printing plate precursor for Comparative Example 3 was obtained by preparing in the same manner as in Example 6 except for using the same weight (as solid content) of ELVACITE 4026 in place of the sulfonic acid-modified cellulose.

Comparative Examples 4 to 7

Lithographic printing plate precursors for Comparative Examples 4 to 7 were obtained by preparing in the same manner as in Example 6 except for using the polysaccharides shown in Table 1 in place of the sulfonic acid-modified cellulose, respectively.

<Evaluation of Lithographic Printing Plate Precursor>
(i) On-Press Development Property The lithographic printing plate precursor obtained was exposed by LUXEL PLATESETTER T-6000III equipped with an infrared semiconductor laser (produced by Fujifilm Corp.) under the conditions of a rotational number of an external drum of 1,000 rpm, laser output of 70% and resolution of 2,400 dpi. The exposed image contained a solid image and a 50% halftone dot chart of a 20 μm-dot FM screen.

The exposed lithographic printing plate precursor was mounted without undergoing development processing on a plate cylinder of a printing machine (LITHRONE 26, produced by Komori Corp.). Using dampening water (ECOL-ITY-2 (produced by Fujifilm Corp.)/tap water=2/98 (by volume ratio)) and SPACE COLOR FUSION-G (N) Black Ink (produced by DIC Graphics Corp.), the dampening water and ink were supplied according to the standard automatic printing start method of LITHRONE 26 to conduct printing on 100 sheets of TOKUBISHI art paper (76.5 kg) at a printing speed of 10,000 sheets per hour.

A number of the printing papers required until the on-press development of the unexposed area of the image-recording layer on the printing machine was completed to reach a state where the ink was not transferred to the printing paper in the non-image area was measured to evaluate the on-press development property.

(ii) Printing Durability

After performing the evaluation for the on-press development property just after the production described above, the printing was continued. As the increase in a number of printing papers, the image-recording layer was gradually abraded to cause decrease in the ink density on a printed material. A number of printed materials wherein a value obtained by measuring a halftone dot area ratio of the 50% halftone dot of FM screen on the printed material using a Gretag densitometer decreased by 5% from the value measured on the 100th paper of the printing was regarded as a number of printed materials at the completion of printing to evaluate the printing durability.

The results of the evaluations above are shown in Table 1.

INDUSTRIAL APPLICABILITY

According to the invention, a lithographic printing plate precursor which exhibits good development property while

TABLE 1

| | Photosensitive Solution | Modified Cellulose | Counter Ion for Sulfonic Acid | Substitution Degree | Molecular Weight (Mw) | On-press Development Property (sheets) | Printing Durability (printable sheets: ×10$^4$) |
|---|---|---|---|---|---|---|---|
| Example 1 | (1) | Cellulose Butyl Sulfonate | Na$^+$ | 0.8 | 25,000 | 15 | 8 |
| Example 2 | (1) | Cellulose Ethyl Sulfonate | Na$^+$ | 0.8 | 25,000 | 10 | 8 |
| Example 3 | (1) | Cellulose Ethyl Sulfonate | K$^+$ | 0.8 | 25,000 | 10 | 8 |
| Example 4 | (1) | Cellulose Ethyl Sulfonate | HN4$^+$ | 0.8 | 25,000 | 10 | 8 |
| Example 5 | (1) | Cellulose Ethyl Sulfonate | TBA$^+$ | 0.8 | 25,000 | 10 | 8 |
| Example 6 | (2) | Cellulose Ethyl Sulfonate | Na$^+$ | 2.5 | 25,000 | 20 | 7.5 |
| Example 7 | (2) | Cellulose Ethyl Sulfonate | Na$^+$ | 1.7 | 25,000 | 20 | 7.8 |
| Example 8 | (2) | Cellulose Ethyl Sulfonate | Na$^+$ | 1.2 | 25,000 | 20 | 8 |
| Example 9 | (2) | Cellulose Ethyl Sulfonate | Na$^+$ | 0.8 | 25,000 | 20 | 8 |
| Example 10 | (2) | Cellulose Ethyl Sulfonate | K$^+$ | 0.8 | 25,000 | 20 | 8 |
| Example 11 | (2) | Cellulose Ethyl Sulfonate | HN4$^+$ | 0.8 | 25,000 | 20 | 8 |
| Example 12 | (2) | Cellulose Ethyl Sulfonate | TBA$^+$ | 0.8 | 25,000 | 20 | 8 |
| Example 13 | (2) | Cellulose Ethyl Sulfonate | Na$^+$ | 0.4 | 25,000 | 20 | 8 |
| Example 14 | (2) | Cellulose Ethyl Sulfonate | Na$^+$ | 0.2 | 25,000 | 30 | 8 |
| Example 15 | (2) | Cellulose Ethyl Sulfonate | Na$^+$ | 0.8 | 2,000 | 25 | 8 |
| Example 16 | (2) | Cellulose Ethyl Sulfonate | Na$^+$ | 0.8 | 3,000 | 20 | 8 |
| Example 17 | (2) | Cellulose Ethyl Sulfonate | Na$^+$ | 0.8 | 50,000 | 25 | 8 |
| Example 18 | (2) | Cellulose Ethyl Sulfonate | Na$^+$ | 0.8 | 80,000 | 30 | 8 |
| Example 19 | (2) | Starch Ethyl Sulfonate | Na$^+$ | 0.8 | 25,000 | 20 | 8 |
| Example 20 | (2) | Inulin Ethyl Sulfonate | Na$^+$ | 0.8 | 25,000 | 20 | 8 |
| Comparative Example 1 | (1) | Ethyl Cellulose | None | 0.8 | 25,000 | 40 | 8 |
| Comparative Example 2 | (1) | — | — | — | 25,000 | 50 | 8 |
| Comparative Example 3 | (2) | — | — | — | 25,000 | 50 | 8 |
| Comparative Example 4 | (2) | Cellulose | None | 0 | 25,000 | 40 | 8 |
| Comparative Example 5 | (2) | Carboxymethyl Cellulose | None | 0.8 | 25,000 | 40 | 8 |
| Comparative Example 6 | (2) | Hydroxypropyl Cellulose | None | 0.8 | 25,000 | 40 | 8 |
| Comparative Example 7 | (2) | Ethyl Cellulose | None | 0.8 | 25,000 | 40 | 8 |

* TBA$^+$ = tetrabutyl ammonium cation

As described above, it can be understood that Examples 1 to 20 using the polysaccharide having a sulfonic acid group or a group made by a salt thereof exhibits good on-press development property while maintaining printing durability of a lithographic printing plate after development in comparison with Comparative Examples 1 to 7 without using the polysaccharide having a sulfonic acid group or a group made by a salt thereof.

maintaining printing durability of a lithographic printing plate after development and a plate making method of a lithographic printing plate using the same can be provided.

Although the invention has been described in detail and by reference to specific embodiments, it is apparent to those skilled in the art that it is possible to add various alterations and modifications insofar as the alterations and modifications do not deviate from the spirit and the scope of the invention.

This application is based on a Japanese patent application filed on Sep. 26, 2012 (Japanese Patent Application No. 2012-213071), and the contents thereof are incorporated herein by reference.

The invention claimed is:

1. A lithographic printing plate precursor comprising a support having provided thereon an image-recording layer capable of forming an image by supplying at least any of printing ink and dampening water on a printing machine after image exposure to remove an unexposed area thereof, wherein the image-recording layer contains an infrared absorbing agent, a polymerization initiator, a polymerizable compound and a polysaccharide having a sulfonic acid group or a group made by a salt thereof, wherein the polysaccharide is cellulose having a sulfonic acid group or a group made by a salt thereof which has a repeating unit represented by the following formula (1):

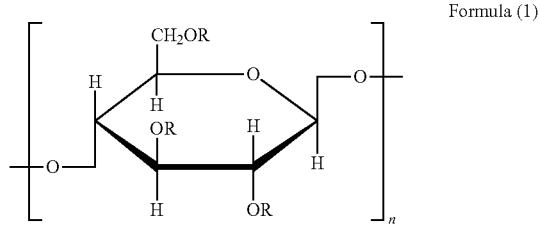

Formula (1)

wherein R each independently represents a hydrogen atom, an alkyl group, a hydroxyalkyl group, a carboxyalkyl group or $-L-SO_3^-X^+$, n represents an integer of 2 or more, L represents an ethylene group or a propylene group, and $X^+$ represents a hydrogen ion, an alkali metal ion or an ammonium ion, provided that of three Rs in the repeating unit represented by formula (1), a number (substitution degree) of R represented by $-L-SO_3^-X^+$ is from 0.3 to 2.5.

2. A plate making method of a lithographic printing plate comprising conducting on-press development processing by a method comprising after imagewise exposure of the lithographic printing plate precursor as claimed in claim 1, mounting the exposed lithographic printing plate precursor on a printing machine and supplying at least any of printing ink and dampening water or a method comprising after mounting the lithographic printing plate precursor as claimed in claim 1 on a printing machine, imagewise exposing the lithographic printing plate precursor and supplying at least any of printing ink and dampening water.

3. The lithographic printing plate precursor as claimed in claim 1, wherein the image-recording layer contains polymer particles.

4. The lithographic printing plate precursor as claimed in claim 3, wherein the polymer particles are hydrophobic thermoplastic polymer particles.

5. The lithographic printing plate precursor as claimed in claim 4, wherein a polymer constituting the hydrophobic thermoplastic polymer particles is a homopolymer or copolymer of a monomer which is selected from the group consisting of ethylene, styrene, vinyl chloride, methyl acrylate, ethyl acrylate, methyl methacrylate, ethyl methacrylate, vinylidene chloride, acrylonitrile, vinyl carbazole, an acrylate or methacrylate having a polyalkylene structure and mixtures thereof.

6. The lithographic printing plate precursor as claimed in claim 5, wherein the image-recording layer contains an organic borate.

7. The lithographic printing plate precursor as claimed in claim 3, wherein the polymer particles are microgel particles.

8. The lithographic printing plate precursor as claimed in claim 7, wherein the image-recording layer contains an organic borate.

9. The lithographic printing plate precursor as claimed in claim 1, wherein the image-recording layer contains an organic borate.

* * * * *